US006566957B1

(12) United States Patent
Caine

(10) Patent No.: US 6,566,957 B1
(45) Date of Patent: May 20, 2003

(54) METHODS AND SYSTEMS FOR A MOSFET-BIPOLAR COMPLIMENTARY SYMMETRY DRIVER WITH LOCAL FEEDBACK FOR BIAS STABILIZATION

(75) Inventor: Steven L. Caine, Lawrenceville, GA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 09/579,657

(22) Filed: May 26, 2000

Related U.S. Application Data

(60) Provisional application No. 60/176,679, filed on Jan. 18, 2000, provisional application No. 60/136,688, filed on May 28, 1999, provisional application No. 60/136,687, filed on May 28, 1999, and provisional application No. 60/136,686, filed on May 28, 1999.

(51) Int. Cl.$^7$ ............................................... H03F 3/04
(52) U.S. Cl. ...................................... 330/296; 330/300
(58) Field of Search ................................ 330/296, 300, 330/255, 269, 273, 264, 267

(56) References Cited

U.S. PATENT DOCUMENTS

| | | | | |
|---|---|---|---|---|
| 3,908,135 A | | 9/1975 | Minami | 307/237 |
| 4,274,058 A | | 6/1981 | Suzuki | 330/253 |
| 4,297,644 A | * | 10/1981 | Ahmed | 330/264 |
| 4,674,119 A | | 6/1987 | Chea, Jr. | 379/400 |
| 4,871,980 A | * | 10/1989 | Gulczynski | 330/295 |
| 4,881,046 A | * | 11/1989 | Tung | 330/277 |
| 5,146,181 A | | 9/1992 | Bowers et al. | 330/268 |
| 5,172,409 A | | 12/1992 | Susak | 379/377 |
| 5,182,469 A | | 1/1993 | Farley et al. | 307/296.2 |
| 5,519,357 A | * | 5/1996 | Eddlemon | 330/264 |
| 5,724,004 A | * | 3/1998 | Reif et al. | 330/277 |
| 5,764,105 A | | 6/1998 | Botker | 330/262 |
| 5,793,256 A | * | 8/1998 | Nagahori et al. | 330/296 |
| 5,861,779 A | * | 1/1999 | Loeppert et al. | 330/277 |
| 5,872,842 A | | 2/1999 | Daly et al. | 379/399 |
| 5,914,634 A | * | 6/1999 | Oberhammer | 327/560 |
| 6,150,853 A | * | 11/2000 | Chrappan et al. | 327/108 |

FOREIGN PATENT DOCUMENTS

EP          0 806 859          11/1997

OTHER PUBLICATIONS

Zojer, et al. "A 150–V Subscriber Line Interface Circuit (SLIC) in a New BiCMOS/DMOS–Technology", IEEE Journal of Solid–State Circuits, vol. 32, No. 9, Sep. 1997, pp. 1475–1480.
Aliahmad, et al., "Integration of a Short–Loop SLIC in a Low–Voltage Submicron BiCMOS Technology", IEEE Journal of Solid–State Circuits, vol. 33, No. 6, Jun. 1998, pp. 850–858.

* cited by examiner

Primary Examiner—Henry Choe
(74) Attorney, Agent, or Firm—Sterne, Kessler, Goldstein & Fox, P.L.L.C.

(57) ABSTRACT

A SLIC assembly includes high voltage operational amplifiers (op amps) and low voltage op amps. The high voltage op amps are used to drive ring and tip signals while the low voltage op amps are used to drive other signals. The low voltage op amps include Class A-B amplifier drivers based on bipolar transistors. Bipolar transistors are also provided as bias compensating diodes for bias point stabilization over dynamic operating conditions such as temperature. The high voltage op amps include a composite MOSFET-bipolar complimentary symmetry driver stage that offers the bias control and stability of a bipolar device topology and drive capabilities of a power MOSFET device.

10 Claims, 13 Drawing Sheets

METHODS AND SYSTEMS FOR A MOSFET-BIPOLAR COMPLIMENTARY SYMMETRY DRIVER WITH LOCAL FEEDBACK FOR BIAS STABILIZATION

CROSS REFERENCE TO RELATED APPLICATIONS

The present application claims priority under 35 U.S.C. §119(e) to provisional Application Nos. 60/136,686, filed May 28, 1999; application Ser. No. 60/136,687, filed May 28, 1999; application Ser. No. 60/136,688, filed May 28, 1999; and application Ser. No. 60/176,679, filed Jan. 18, 2000. All these applications are expressly incorporated herein by referenced as though fully set forth in full.

FIELD OF THE INVENTION

The present invention relates to telecommunications systems, and more particularly, to telephony interface systems and techniques.

BACKGROUND OF THE INVENTION

With integration of digital logic circuits into analog circuits operating with DC and AC voltages and currents, a circuit with a BORSCHT function is typically used to interface between analog and digital circuits. BORSCHT stands for the functions of battery feed, over-voltage protection, ringing, signaling, coding, hybrid and testing. The BORSCHT functions are typically contained in a circuit called a subscriber line interface circuit (SLIC). SLIC's are typically used to interface between a central office and subscriber telephone instruments in a subscriber line interface, which is also called a local loop.

SUMMARY OF THE INVENTION

In one aspect of the present invention, a MOSFET-bipolar driver includes a MOSFET output driver, and a bias compensating bipolar transistor diode coupled to the MOSFET output driver.

In another aspect of the present invention, a MOSFET-bipolar driver including first and second MOSFET output drivers each having an output coupled to the output of the other MOSFET output driver, and a bias compensating bipolar transistor diode coupled to the first and second MOSFET output drivers.

In yet another aspect of the present invention, a method of driving output signals includes outputting signals with a MOSFET, and bias compensating the MOSFET with a bias compensating bipolar transistor diode.

It is understood that other aspects of the present invention will become readily apparent to those skilled in the art from the following detailed description, wherein it is shown and described only embodiments of the invention by way of illustration of the best modes contemplated for carrying out the invention. As will be realized, the invention is capable of other and different embodiments and its several details are capable of modification in various other respects, all without departing from the spirit and scope of the present invention. Accordingly, the drawings and detailed description are to be regarded as illustrative in nature and not as restrictive.

DESCRIPTION OF THE DRAWINGS

These and other features, aspects, and advantages of the present invention will become better understood with regard to the following description, appended claims, and accompanying drawings where:

DETAILED DESCRIPTION

Figure 1:
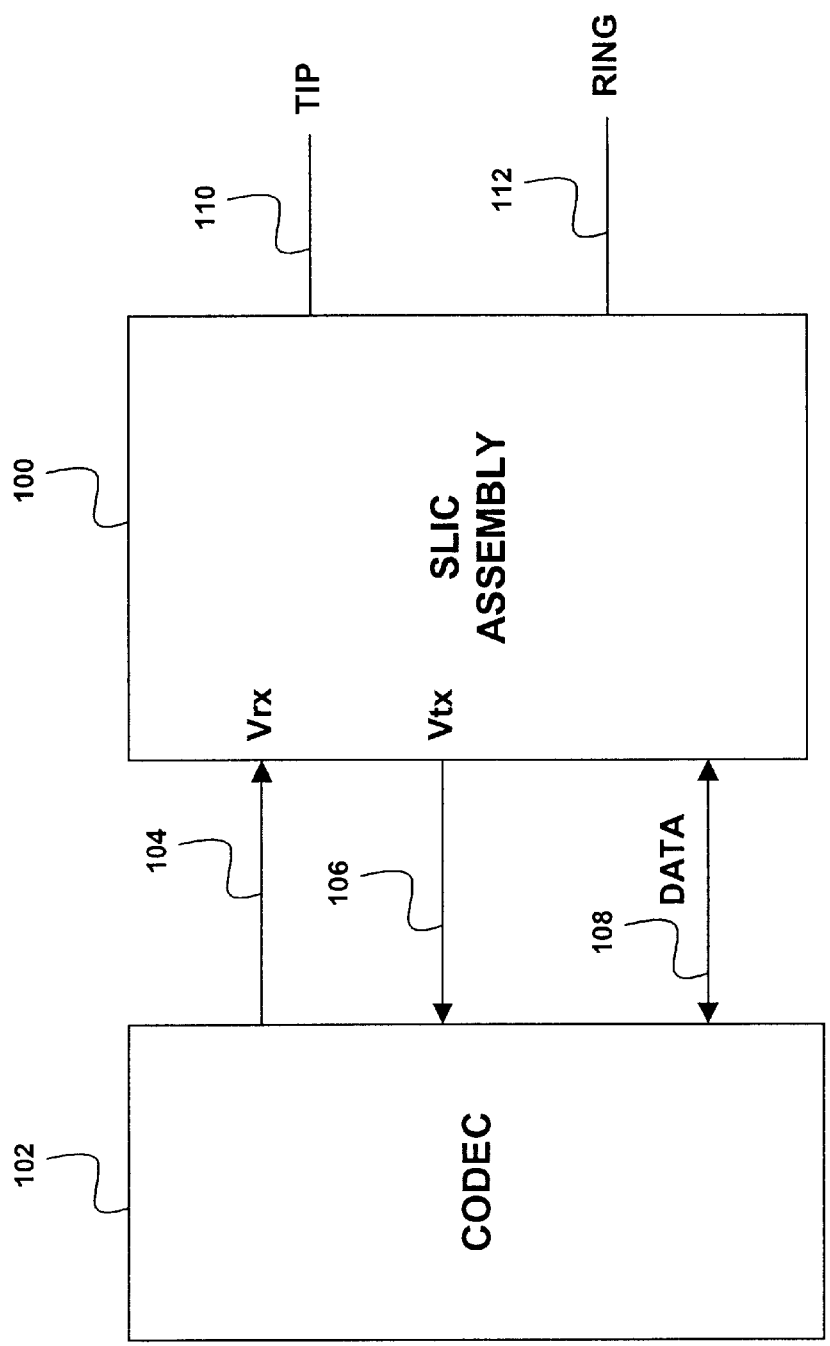
FIG. 1 is a block diagram of an interface between a coder-decoder (CODEC) and a subscriber line interface circuit (SLIC) assembly.

In an embodiment of the present invention, a SLIC assembly interfaces with a coder-decoder (CODEC) to provide bi-directional communication between analog telephony devices and a digital transmission medium. The CODEC translates analog signal samples received from the SLIC assembly into a set of bits. The CODEC also translates sets of bits received from the digital transmission medium into analog signals. The CODEC may include an analog-to-digital converter (ADC) for transmission from the SLIC assembly and a digital-to-analog converter (DAC) for reception to the SLIC.

In the following embodiments of the invention, common reference numerals are used, when appropriate, throughout to represent the same components.

FIG. 1 is a block diagram of an interface between a SLIC assembly 100 and a CODEC 102 in accordance with an embodiment of the present invention. The SLIC assembly 100 communicates with the CODEC 102 over a transmitting (Vtx) interface 106 and a receiving (Vrx) interface 104 for transmitting and receiving, respectively, telephony data to and from the CODEC 102. Other data, such as SLIC control and ringing data, are communicated over a data interface 108. The SLIC assembly 100 typically interfaces with a telephony device for full duplex bi-directional communication over a telephony line such as tip and ring interfaces 110 and 112. The telephony device may include traditional analog telephones as well as digital equipment. For example, the digital equipment may be coupled to the tip and ring interfaces 110 and 112 through a modem (modulator-demodulator).

Figure 2:
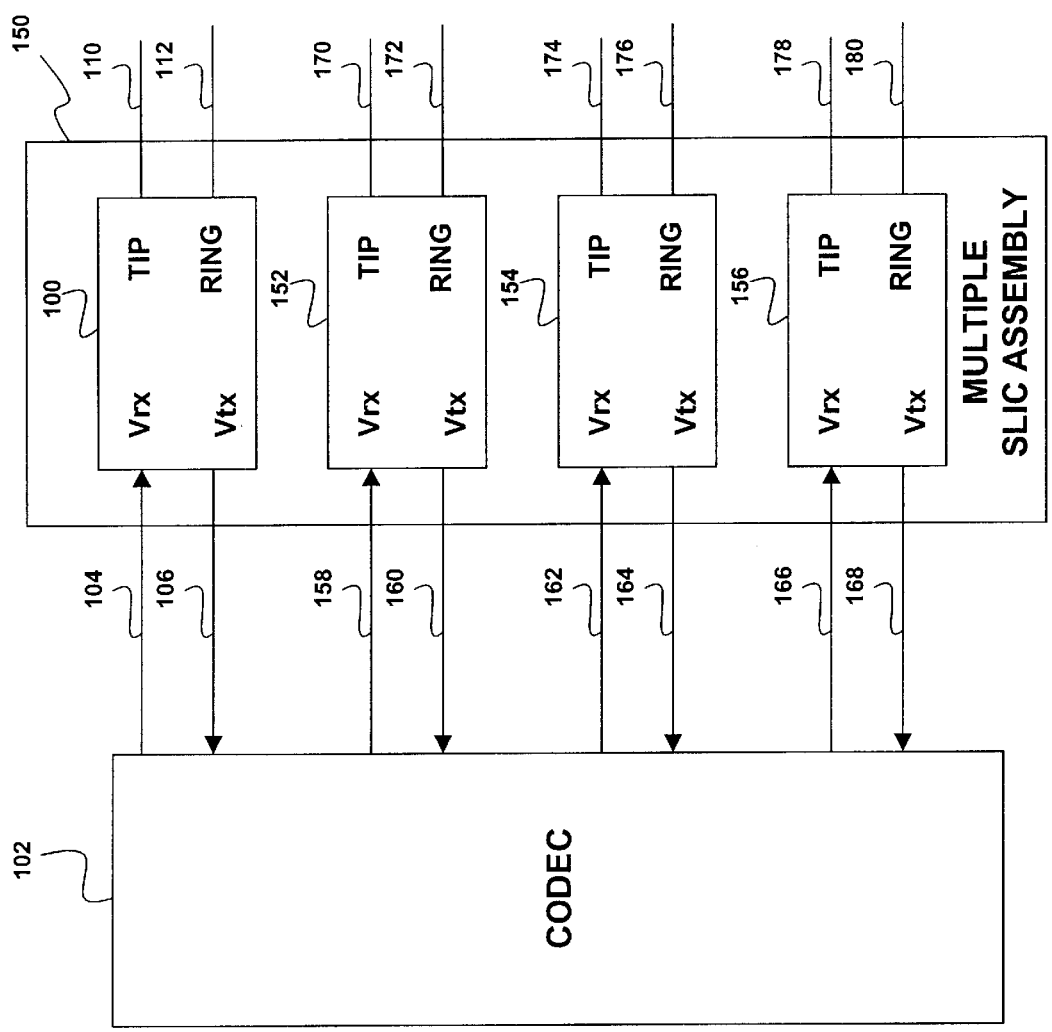
FIG. 2 is a block diagram of interfaces between a CODEC and a quad-SLIC assembly.

In one embodiment of the present invention, multiple SLIC assemblies may be fabricated on a single integrated circuit chip and/or packaged into a single integrated package. FIG. 2 is a block diagram of a multiple SLIC assembly 150, which includes four SLIC assemblies integrated into a single package. As those skilled in the art will appreciate, a multiple SLIC assembly may include any number of SLIC assemblies. A CODEC 102 may include a single CODEC that interfaces with all four SLIC assemblies. Alternatively, the CODEC 102 may also include four individual CODEC's.

The multiple SLIC assembly 150 includes SLIC assemblies 100, 152, 154 and 156. A first SLIC assembly 100 communicates with the CODEC 102 over transmitting and receiving interfaces 106 and 104. A second SLIC assembly 152 communicates with the CODEC 102 over transmitting and receiving interfaces 160 and 158. A third SLIC assembly 154 communicates with the CODEC 102 over transmitting and receiving interfaces 164 and 162. A fourth SLIC assembly 156 communicates with the CODEC 102 over transmitting and receiving interfaces 168 and 166. Each SLIC assembly 100, 152, 154 and 156 communicates with a telephony device assembly over tip and ring interface pairs, 110 and 112, 170 and 172, 174 and 176, and 178 and 180, respectively.

1. Advanced Differential SLIC Interface for Low Voltage Operation

SLIC's and CODEC's typically have been single-ended devices. Use of a differential CODEC typically results in a good signal-to-noise ratio and facilitates a high system level integration of CODEC functions with other system level resources that may otherwise be discrete.

In one embodiment of the present invention, a differential SLIC is used to interface with a differential CODEC. In another embodiment of the present invention, a SLIC assembly includes a single-ended SLIC and a SLIC interface circuit. The SLIC interface circuit provides an interface between the single-ended SLIC and a differential CODEC.

Figure 3:
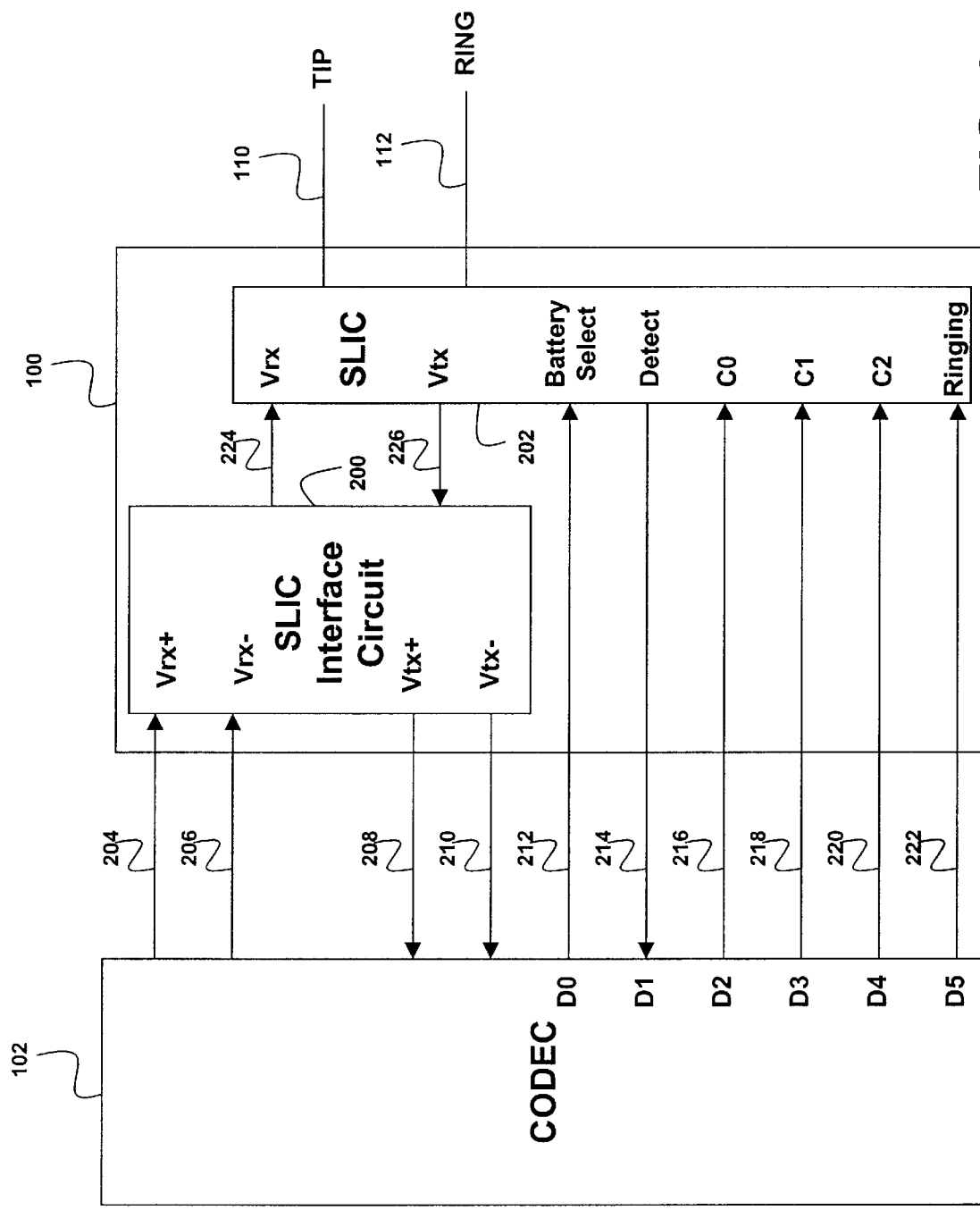
FIG. 3 is a block diagram of an interface between a differential CODEC and a single-ended SLIC through a SLIC interface circuit.

FIG. 3 is a block diagram of a SLIC assembly and CODEC. The SLIC assembly 100 includes a SLIC interface circuit 200 between the CODEC 102 and a SLIC 202. The SLIC interface circuit 200 provides an interface between the differential CODEC 102 and the single-ended SLIC 202.

The CODEC 102 interfaces with the SLIC interface circuit 200 over a differential interface. The differential interface includes a differential pair of receiving lines 204 and 206. Over these receiving lines, the SLIC interface circuit 200 receives telephony signals Vrx+ and Vrx−. The SLIC interface circuit 200 converts the received differential signals Vrx+ and Vrx− into a single-ended telephony signal Vrx, and provides it over a receiving line 224 to the SLIC 202.

The SLIC 202 provides a single-ended transmit signal Vtx to the SLIC interface circuit 200 over a transmitting line 226. The SLIC interface circuit 200 converts the received single-ended transmit signal into a differential pair of transmit signals Vtx+ and Vtx−, and provides them to the CODEC 102 over a differential pair of transmitting lines 208 and 210.

The SLIC 202 also communicates directly with the CODEC 102. The CODEC 102 provides a battery select signal 212 to the SLIC 202. The battery select signal 212 is used to select between one of two selectable battery voltages for power savings. The battery voltages typically are −24V for talking and −75V for ringing. The power savings are generally realized in the off hook state due to use of the lower voltage, e.g., −24V. The SLIC 202 may also receive a reference voltage (not shown) from the CODEC for better system accuracy during its operation.

When a call is made from a remote resource to a telephony device during an on hook condition, the CODEC 102 sends a ringing signal 222 to the SLIC 202. The SLIC 202 generates voltages for ringing on tip and ring interfaces 110, 112 providing an alternating current (AC) source to a telephony device. In response, the telephony device provides an indicator to a user, e.g., a bell on the telephony device rings.

If the call is answered, e.g., by lifting a handset, direct current (DC) loop detection is used to determine an off hook condition when the handset is lifted. The DC loop is formed between the SLIC 202 and the telephony device over the tip and ring interfaces 110 and 112. When the SLIC 202 detects the off hook condition, the SLIC provides a detect signal 214 to the CODEC. The CODEC, in response, stops sending the ringing signal 222.

The CODEC 102 in the described embodiment also sends data signals C0, C1 and C2 to the SLIC 202 over data interfaces 216, 218 and 220, respectively. The data signals control the operational state of the SLIC 202 such as DC output voltages, ringing state, on hook transmission, etc.

Figure 4:
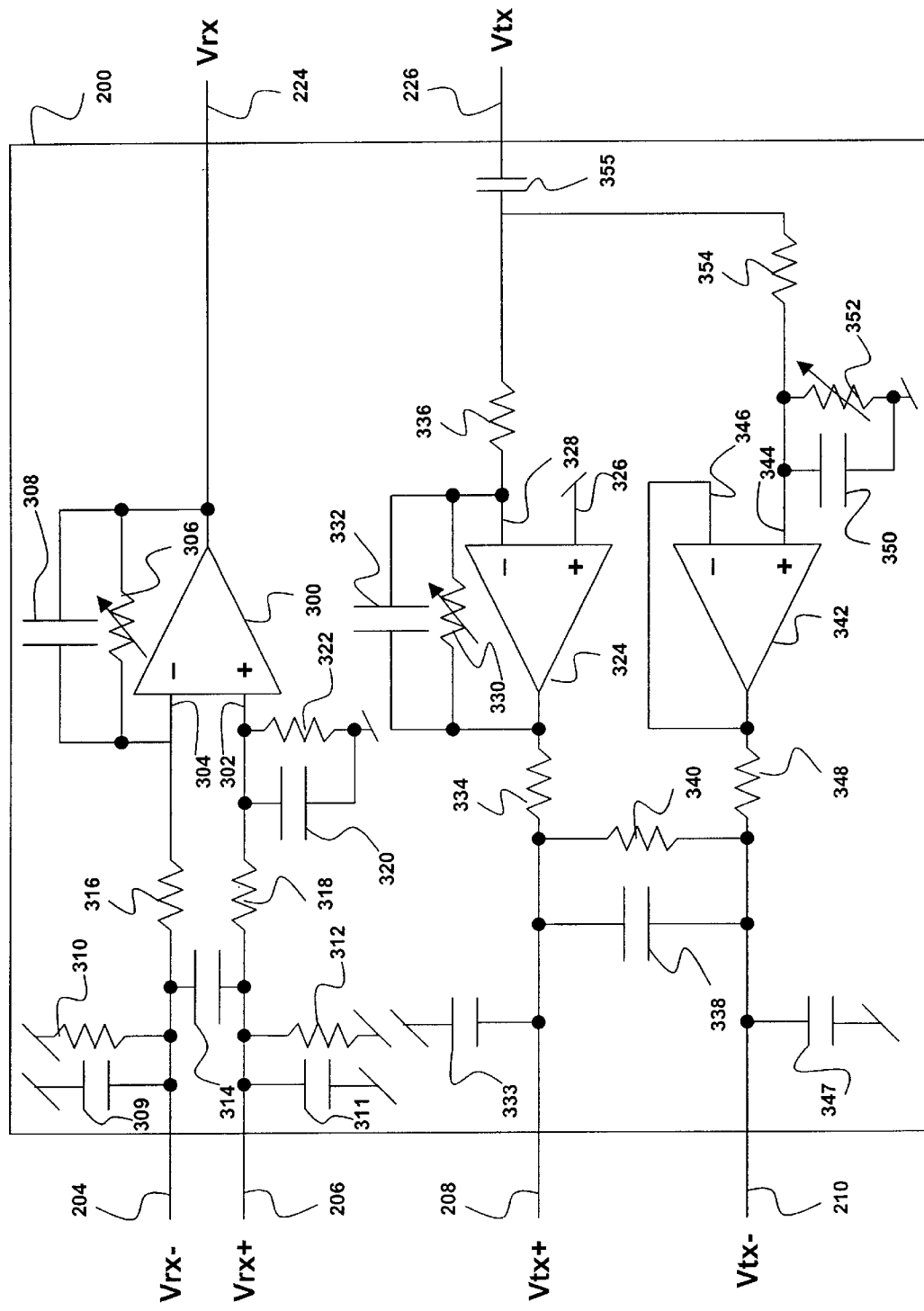
FIG. 4 is a circuit diagram of an interface between a CODEC and a single-ended SLIC.

FIG. 4 is a circuit diagram of a SLIC interface circuit 200 in one embodiment of the present invention. The SLIC interface circuit 200 includes three operational amplifiers (op amps) 300, 324 and 342. The op amp 300 is used to convert the differential receive signals Vrx+ and Vrx− received from the CODEC over receiving lines 204 and 206 into a single-ended receive signal Vrx. The op amp 300 provides the single-ended receive signal Vrx to the SLIC over a receiving line 224.

The op amps 324 and 342 are used to convert a single-ended transmit signal Vtx received from the SLIC over a transmitting line 226 into a differential pair of transmit signals Vtx+ and Vtx−. The differential transmit signals Vtx+ and Vtx− are provided to the CODEC.

The Vrx+ and Vrx− signals received over the receiving lines 204 and 206 are typically in the form of current outputs. Thus, in a receiving path, current-voltage conversion resistors 310 and 312 are coupled to the receiving lines 204 and 206, respectively. The other ends of the current-voltage conversion resistors 310 and 312 are coupled to a negative voltage supply, e.g., ground, and provides biasing between the negative voltage supply and the receiving lines 204 and 206, respectively.

The receiving lines 204 and 206 are also coupled to filtering capacitors 309 and 311, respectively. The other end of the filtering capacitors 309 and 311 are coupled to the negative voltage supply, e.g., ground. The filtering capacitors 309 and 311 are used as low pass filters to filter high frequency components of the Vrx− and Vrx+ signals, respectively.

A filtering capacitor 314 is coupled between the receiving line 204 and the receiving line 206. The filtering capacitor 314 is used as a low pass filter to filter high frequency components of the Vrx− and Vrx+ signals. Gain setting resistors 316, 318 are coupled between the receiving lines 204, 206 and inverting and non-inverting inputs 304, 302 of the op amp 300, respectively. The gain setting resistors 316 and 318 are used to adjust the gain of the op amp 300.

The non-inverting input 302 of the op amp 300 is also coupled to one end of a filtering capacitor 320 and one end of a bias resistor 322. The other ends of the filtering capacitor 320 and the bias resistor 322 are coupled to the negative voltage supply. The filtering capacitor 320 and the bias resistor 322 form a parallel RC-circuit between the non-inverting input 302 of the op amp 300 and the negative voltage supply. The filtering capacitor 320 is used to further filter high frequency components of the Vrx+ signal.

The op amp 300 provides an output as the single-ended receive signal Vrx over the receiving line 224. The output of the op amp 300 is also fed back into the inverting input 304 through a filtering capacitor 308 and a variable resistor 306 in parallel. The gain in the signal receiving path may be controlled by varying the resistance of the variable resistor 306. The filtering capacitor 308 is used to low pass filter high frequency components in the feedback path of the Vrx signal.

The single-ended transmit signal Vtx received over the transmitting line 226 is provided to the op amps 324 and 342 for conversion into a differential pair of transmit signals Vtx− and Vtx+, which are provided to the CODEC over the transmitting lines 208 and 210, respectively.

The single-ended transmit signal Vtx is provided over the transmitting line 226 to an inverting input 328 of the op amp 324 through an ac-coupling capacitor 355 and a gain setting resistor 336 in series. A non-inverting input 326 of the op amp 324 is coupled to the negative voltage supply. An output of the op amp 324 is provided as the negative differential signal Vtx− through a gain setting resistor 334. The output of the op amp 324 is also fed back into the inverting input 328 through a filtering capacitor 332 and a variable resistor 330 in parallel. The resistor is used to adjust gain while the capacitor is used for low pass filtering to provide anti-aliasing filtering. The gain of the op amp 324 may be adjusted by varying the resistance of the variable resistor 330.

The single-ended transmit signal Vtx is also provided to a non-inverting input 344 of the op amp 342 through the ac-coupling capacitor 355 and a gain setting resistor 354 in series. The non-inverting input 344 is also coupled to the negative voltage supply through a filtering capacitor 350 and a variable resister 352, which form a parallel RC-circuit.

An output of the op amp 342 is provided as the positive differential transmit signal Vtx+ over the transmitting line 210 through a gain setting resistor 348. The output of the op amp 342 is also fed back into an inverting input 346 of the op amp 342. A filtering capacitor 338 and a gain setting resistor 340 are coupled in parallel between the differential transmitting lines 208 and 210. Thus, the filtering capacitor 338 and the gain setting resistor 340 form a parallel RC-circuit between the differential transmitting lines 208 and 210. The resistor is used to adjust gain while the capacitor is used for low pass filtering to provide anti-aliasing filtering. The gain of the op amp 342 may be controlled by adjusting the resistance of the variable resistor 352.

2. DSP Based Switched Mode Class D SLIC

Figure 5:
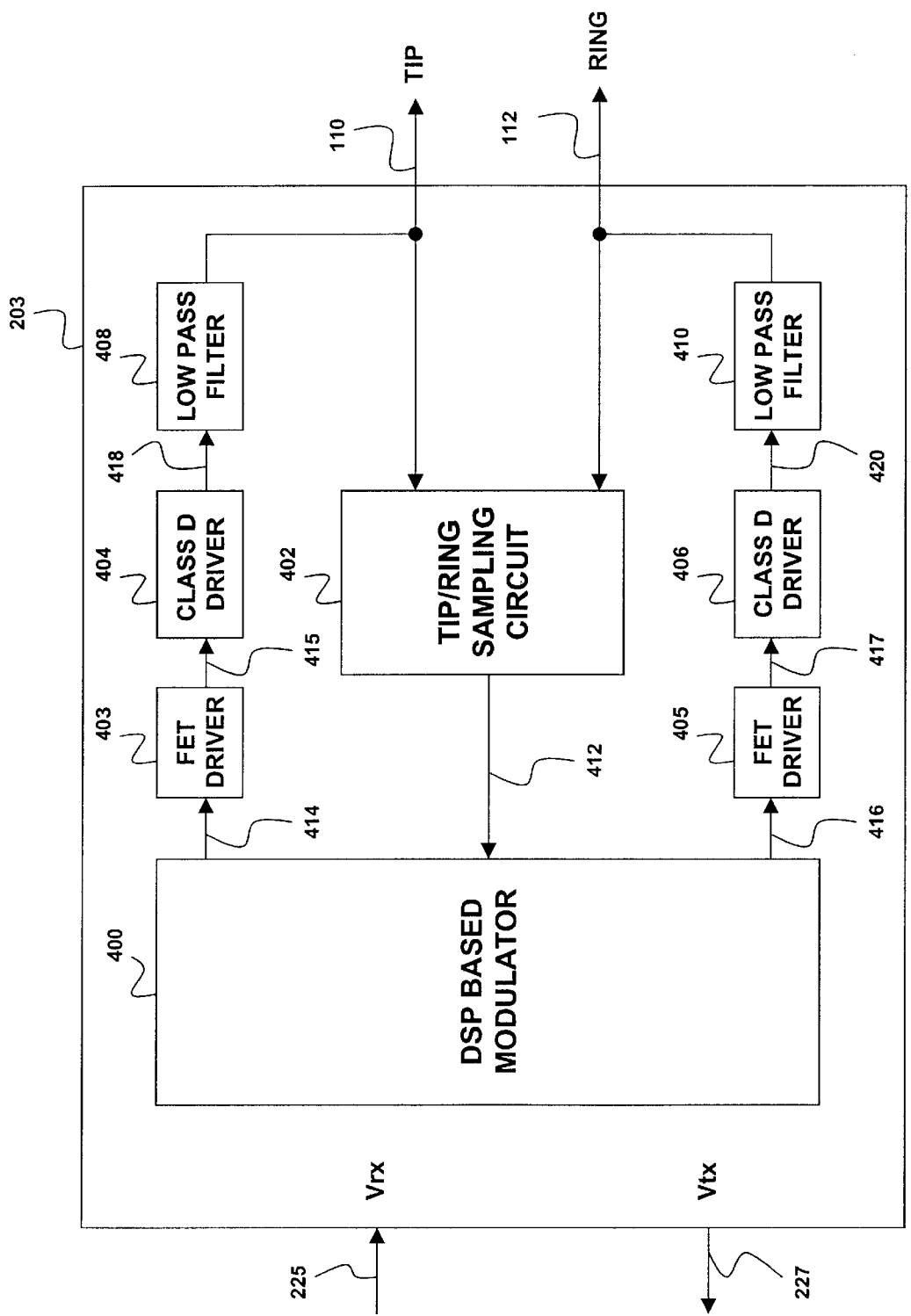
FIG. 5 is a block diagram of a DSP-based switched mode class D SLIC.

The embodiments of the present invention discussed thus far pertain to CODECs designed to covert a digital data stream into an analog audio signal for delivery to the SLIC. The SLIC then performs the voltage level conversion required by the telephone equipment on the telephony line. In an alternative embodiment of the present invention, the digital data stream can be delivered by the CODEC directly to the SLIC. This approach allows the voltage level conversion process to be performed by the SLIC in the digital domain. FIG. 5 is an exemplary embodiment of such approach. A DSP based SLIC 203 is used with class D switched mode amplifiers. The SLIC 203 receives a Vrx signal 225 and transmits a Vtx signal 227. In the described embodiment, the Vrx and Vtx signals 225 and 227 are digital signals. The SLIC 203 also provides tip and ring interfaces 110 and 112. The SLIC 203 includes a DSP based modulator 400, a pair of FET drivers 403 and 405, a pair of Class D drivers 404 and 406, a pair of low pass filters 408 and 410, and a tip/ring sampling circuit 402.

In the described embodiment, in order to reduce power dissipation, the Class D drivers 404 and 406 are implemented under control of the DSP based modulator 400. Power reduction can be achieved by switching the current from the power source off and on rather than allowing continuous current flow. In other embodiments, other types of switched mode circuits may be used to switch the power source current off and on.

The DSP based modulator 400 measures the tip and ring voltages using the tip/ring sampling circuit 402 to synthesize desired AC and DC impedances for AC impedance matching, DC biasing and power control. The DSP based modulator 400 can be a low voltage CMOS device, which typically provides an output between 1.8V to 3.3V. Since the output of the DSP modulator 400 is generally insufficient to turn on power FET's all the way, FET drivers 403 and 405 are used in the described embodiment as gate drive buffers to drive Class D drivers 404 and 406, respectively.

The DSP based modulator 400 provides control signals 414 and 416, respectively, to drive the FET drivers 403 and 405, respectively. The FET drivers 403 and 405, in turn, provide drive signals 415 and 417, respectively, to the Class D driver 404 and the Class D driver 406 to turn them on and off. In the described embodiment, the control signals 414 and 416 are digital signals, e.g., pulse width modulated (PWM) signals. The control signals 414 and 416 may include AC and DC impedance information for AC impedance matching, DC biasing as well as power control.

The DSP based modulator 400 alters the control signals using feedback from the tip/ring sampling circuit 402 to synthesize the proper voltages, currents and impedances. The control signals 414 and 416 in the described embodiment are high frequency PWM signals. With the Class D drivers either on or off, instead of operating continuously, power dissipation is typically reduced.

Outputs 418 and 420 of the Class D drivers 404 and 406 are provided to the low pass filter 408 and the low pass filter 410, respectively, to filter high frequency components. With the switching action of the Class D drivers at very high frequencies relative to the desired output frequencies, the low pass filters 408 and 410 can attenuate undesirable high frequencies in the outputs 418 and 420, and provide low frequency signals to the tip and ring interfaces 110 and 112, respectively.

The telephony signals provided to the SLIC 203 over the tip and ring interfaces 110 and 112 for upstream communication are received by the tip/ring sampling circuit 402. The tip/ring sampling circuit 402 processes the received telephony signals and provides a processed signal 412 to the DSP based modulator 400. The processed signal 412 includes upstream data in addition to the feedback information, e.g., voltage and current samples of tip and ring signals, used to control DSP algorithms. The DSP algorithms use the feedback information to compute proper impedances, voltages and currents.

Figure 6:
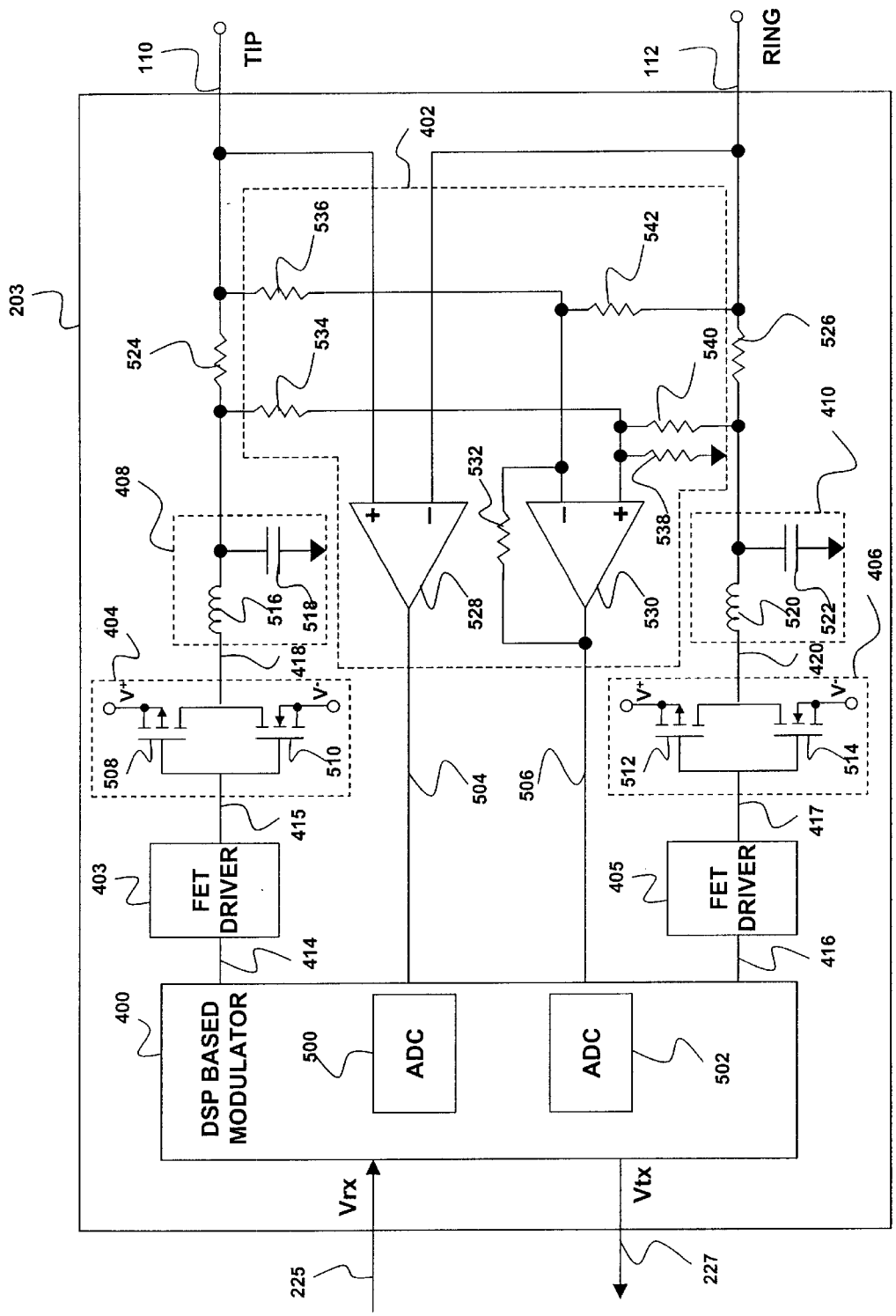
FIG. 6 is a circuit diagram of a DSP-based switched mode class D SLIC.

FIG. 6 is a circuit diagram of the described embodiment of the SLIC 203. The DSP modulator 400 provides the control signals 414 and 416 to the FET drivers 403 and 405, respectively. The FET drivers 403 and 405 provide the drive signals 415 and 417 to the Class D drivers 404 and 406, respectively. The Class D drivers 404 and 406 have a similar structure in this embodiment. In other embodiments, however, the Class D drivers 404 and 406 may have different structures.

The Class D driver 404 includes a p-channel MOSFET (Metal Oxide Semiconductor Field Effect Transistor) 508 and an n-channel MOSFET 510. When used as switches, MOSFET's generally have an advantage over their bipolar counterparts in that turn-off time is not delayed by minority carrier storage since the current in field-effect transistors is typically due to the flow of majority carriers only. The MOSFET's 508 and 510 can be enhancement type and with VMOS (V-shaped MOSFET) design. The VMOS design may be used to fabricate both n-channel and p-channel MOSFET's. In other embodiments, the MOSFET's may be other types of MOSFET's such as PMOS or NMOS.

A gate of the p-channel MOSFET 508 is coupled to the drive signal 415 from the FET driver 403. A source of the p-channel MOSFET 508 is coupled to a positive voltage supply V+. The drain of the p-channel MOSFET 508 is coupled to a driver output 418 and a drain of the n-channel MOSFET 510. A gate of the n-channel MOSFET 510 is coupled to the drive signal 415. A source of the n-channel MOSFET 510 is coupled to a negative voltage supply V−. The drain of the n-channel MOSFET 510 is coupled to the driver output 418 and the drain of the p-channel MOSFET 508. The p-channel MOSFET 508 may be replaced with an n-Channel MOSFET when proper level shift circuitry is used.

The p-channel MOSFET 508 and the n-channel MOSFET 510 typically are not operating in a turned-on state at the same time. Based on the voltage level of the drive signal 415, i.e., based on the voltage level of the control signal 414, either the p-channel MOSFET 508 or the n-channel MOSFET 510 turns on.

When the voltage level of the control signal 414 is sufficiently low, i.e., $V_{GS}$ (gate-to-source voltage)$<V_{T1}$ (first threshold voltage), the p-channel transistor 508 turns on, providing a logic high voltage to the low pass filter 408 using the driver output 418. The first threshold voltage $V_{T1}$ is typically between 1 and 2 Volts. The low pass filter 408 provides a filtered output through a current-limiting resistor 524 as the tip signal output of the SLIC 203 over the tip interface 110. The current-limiting resistor 524 is used for current limiting and loop current sensing. While the p-channel transistor 508 is operating in a turned-on state, the n-channel transistor 510 is typically at a turned-off state.

On the other hand, when the voltage level of the control signal 414 is sufficiently high, i.e., $V_{GS}>V_{T2}$ (second threshold voltage), the n-channel transistor 510 turns on, providing a logic low voltage to the low pass filter 408 using the driver output 418. The second threshold voltage $V_{T2}$ is typically between 1 and 2 Volts. While the n-channel transistor 510 is operating in a turned-on state, the p-channel transistor 508 typically is at a turned-off state.

The low pass filter 408 includes an inductive element 516 and a capacitive element 518. A first terminal of the inductive element 516 is coupled to the driver output 418. A second terminal of the inductive element 516 is coupled to a first terminal of the capacitive element 518, and is also provided as the filtered output. A second terminal of the capacitive element 518 is coupled to a negative voltage supply, e.g., ground.

The D Class driver 406 is structured similarly and operates similarly to the D Class driver 404. The D Class driver 406 includes a p-channel MOSFET 512 and an n-channel MOSFET 514. The DSP based modulator 400 provides the control signal 416 to the FET driver 405. In response, the FET driver 405 provides the drive signal 417 to the gates of the MOSFET's 512 and 514 to provide a driver output 420 to the low pass filter 410. The low pass filter 410 includes an inductive element 520 and a capacitive element 522. The low pass filter 410 is structured similarly and operates similarly as the low pass filter 408. The low pass filter 410 provides a filtered output through a current-limiting resistor 526 as the ring signal output of the SLIC 202 over the ring interface 112. The current-limiting resistor 526 is typically used for current-limiting and loop current sensing.

The tip/ring sampling circuit 402 includes a voltage sampling amplifier 528 and a current sampling amplifier 530. The tip signal is provided to a non-inverting input of the voltage sampling amplifier 528. The ring signal is provided to an inverting input of the voltage sampling amplifier 528. The voltage sampling amplifier 528 takes a difference between the tip signal 110 and the ring signal 112 and provides a voltage difference signal 504 to the DSP based modulator 400.

The voltage difference signal 504 is received by an ADC 500 in the DSP based modulator 400. The ADC 500 converts the voltage difference signal 504 into digital format, and the DSP based modulator 400 uses it along with a digitized current difference signal to calculate the DC and AC impedances. The DSP based modulator uses the DC and AC impedances to update the proper operating conditions for, by way of example, DC voltage, AC impedance, current limit, etc.

The filtered output of the low pass filter 408 is provided to a non-inverting input of the current sampling amplifier 530 through a voltage divider resistor 534. The non-inverting input of the current sampling amplifier 530 is also coupled to the negative voltage supply, e.g., ground, through a bias resistor 538. The ring signal is coupled to the non-inverting input of the current sampling amplifier 530 through a voltage divider resistor 542. The voltage divider resistor 542 is used for voltage scaling to the common mode range of the amplifier.

The filtered output of the low pass filter 410 is provided to an inverting input of the current sampling amplifier 530 through a voltage divider resistor 540. The tip signal is coupled to the inverting input of the current sampling amplifier 530 through a voltage divider resistor 536. The voltage divider resistor 536 is used for voltage scaling to the common mode range of the amplifier.

A current difference signal 506 is provided by the current sampling amplifier 530 to the DSP based modulator 400. The current difference signal 506 is also fed back into the inverting input of the current sampling amplifier 530 through a feedback resistor 532. The feedback resistor 532 is used to scale and sum sensing voltages to the common mode range of voltages for measuring current. The current difference signal 506 is received by an ADC 502 in the DSP based modulator 400. The ADC 502 converts the current difference signal 506 into digital format and, with the digitized voltage difference signal 504, calculates the AC and DC impedances of the SLIC. As described earlier, the DSP based modulator uses the DC and AC impedances to set the proper operating conditions for, by way of example, DC voltage, AC impedance, current limit, etc.

Figure 7:
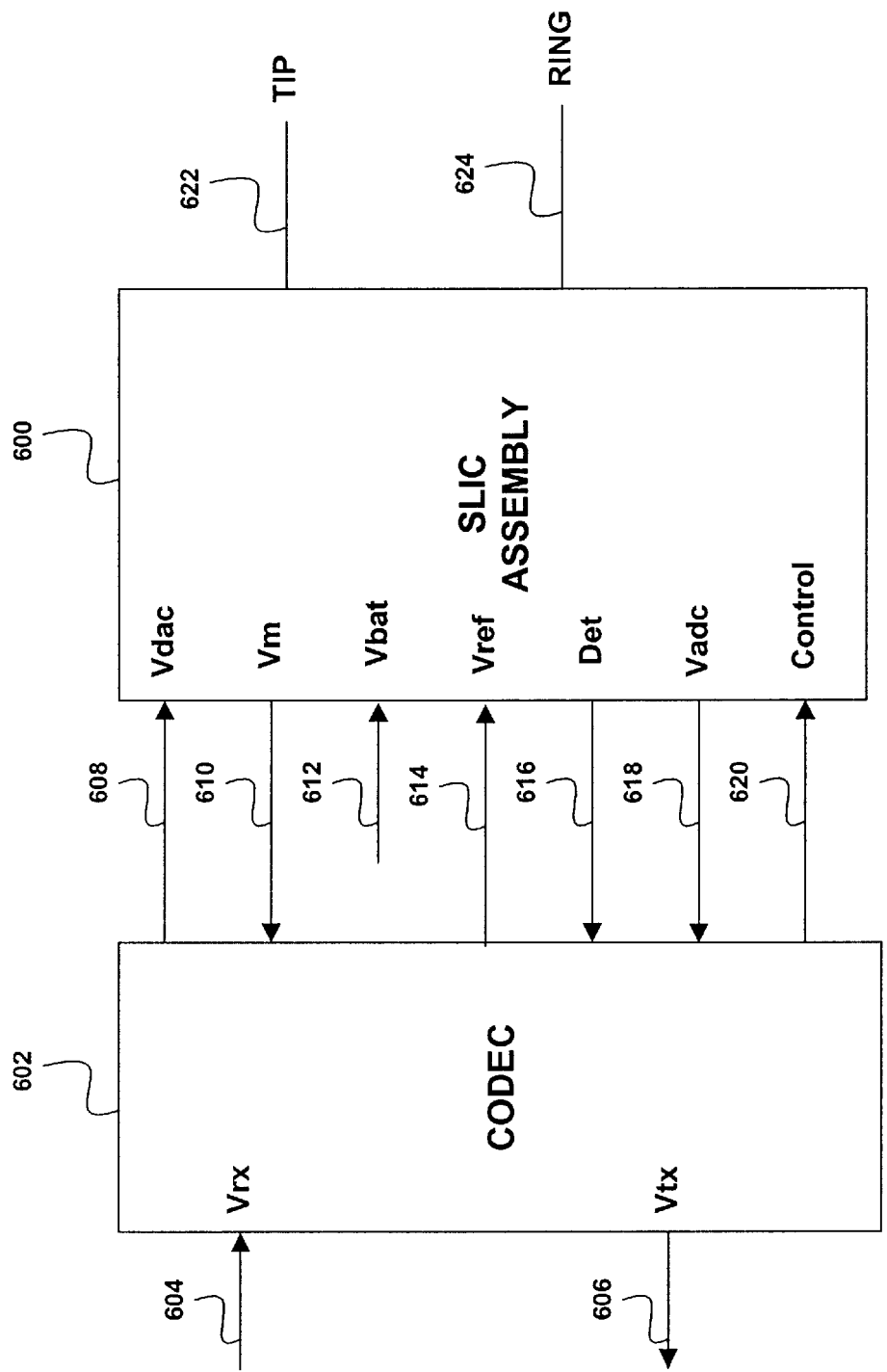
FIG. 7 is a block diagram of an interface between a CODEC and a simplified DSP-based SLIC.

3. DSP Based SLIC Architecture With Current Sensing-Voltage Synthesis Impedance Matching and DC Feed Control FIG. 7 is a block diagram of a DSP based SLIC assembly 600 coupled to a CODEC 602 in one embodiment of the present invention. The CODEC 602 can be a highly integrated device that performs all signal processing functions of the SLIC assembly 600. The CODEC 602 may be scaled down in size with emerging silicon or other process technologies for fabricating devices that have smaller dimensions. AC and DC impedance synthesis and control can be performed in the digital domain by the CODEC 602. The SLIC assembly 600 and the CODEC 602 may be used in VoIP applications.

The SLIC assembly architecture illustrated in FIG. 7 has a DSP design with a high voltage SLIC assembly acting primarily as an analog buffer and all signal processing performed in the digital domain by the CODEC. The CODEC 602 may be implemented using scalable low voltage CMOS. The SLIC/CODEC combination provides the BORSCHT (battery feed, over voltage protection, ringing, signaling, coding, hybrid and test) functions.

The SLIC assembly and CODEC combination in the described embodiment can meet the overall system level analog transmission requirements of Bellcore TR-NWT-000057 and ETSI 300 standards as applicable to short loop applications. This embodiment can meet the requirements of Bellcore TA-NWT-000909 standard, while reducing power consumption. Measures can be taken to minimize power in the idle standby state as well as during off hook transmission and ringing, with the highest priority given to the power reduction in the idle standby state.

Bellcore TA-NWT-000909 specifically addresses short loop transmission and signaling requirements found in FITL (fiber in the loop) systems. Since no ubiquitous requirements exist for analog transmission and signaling for hybrid filter coax networks, TA-NWT-000909 forms a basis set of requirements for cable IP telephony.

In the described embodiment, the combination of the CODEC and the SLIC assembly include the following features. The CODEC and the SLIC assembly perform all battery feed, over-voltage protection, ringing, signaling, coding, hybrid and test (BORSCHT) functions. This embodiment can also be configured to exceed LSSGR (Bellcore—better transmission performance than specified) and ITU central office requirements. DC loop characteristics and loop supervision detection thresholds can be software programmable in the CODEC. The programmable features include ring trip thresholds, current limit and off detect threshold.

The features of the CODEC and the SLIC assembly combination can also include off hook detection and 2-wire AC impedance. Off hook and ring-trip detectors have programmable thresholds. The described embodiment of can also provide ringing with no external hardware. Other features may include integrated ring-trip filter and software enabled manual or automatic ring-trip mode. This embodiment preferably supports loop-start signaling. The 2-wire interface voltages and currents can be monitored for subscriber line diagnostics. The CODEC and the SLIC assembly also may have built-in-test (BIT) modes.

The integrated line-test and self-test features of the described embodiment include: leakage, capacitance and noise test; loop resistance (A to B and to ground and battery) test; echo gain and distortion test; idle channel noise test; and ringing test. The CODEC and the SLIC assembly can also support on hook transmission and power/service denial mode.

The described embodiment can be configured to be compatible with inexpensive protection networks, and accommodates low tolerance fuse resistors while maintaining longitudinal balance. The line-feed characteristics can be independent of battery voltage. The described embodiment can provide linear power-feed with power management and automatic battery switching. Only a 5V or 3.3V power supply and battery supply are typically needed. Other features may include low idle-power per line, −40 degree C. to 85 degree C. industrial operation and small physical size.

The SLIC assembly 600 is a high voltage device that mainly acts as a buffer between the low voltage signal processing circuitry, i.e., CODEC, and the high voltage subscriber loop side for outgoing and incoming signals. With a DSP based AC impedance synthesis loop, numerous applications may be realized through software/firmware programmability of the desired output impedance of the SLIC for both real and complex impedances.

With DSP control over the DC operating points of tip and ring, the DC voltage level may be used to control the loop current for the desired operating conditions in the off hook status, ringing and fault conditions, i.e., current limiting. For on/off hook states, tip and ring signals may be fed with different DC offsets to provided DC loop current and the necessary amplifier headroom to be able to drive the AC voice signal in a non-distorted manner.

With DSP control of the DC feed in the ringing state, the SLIC assembly may operate in a balanced, non-balanced or balanced with DC-offset ringing mode. In the balanced ringing mode, tip and ring signals can be driven with the same DC voltages but differential AC voltages, thus producing a balanced differential ringing signal. In the unbalanced ringing mode, the tip lead can be at zero volts while the ring lead provides a negative DC bias and a high amplitude AC ringing signal, single-ended instead of differential. For DC-offset ringing, both tip and ring signals are driven differentially with AC in a balanced manner; however, the tip and ring signals have different DC voltages. This provides balanced ringing with DC-offset.

Referring back to FIG. 7, the CODEC 602 transmits a Vtx signal 606 and receives a Vrx signal 604 to and from a central office and interfaces with the SLIC assembly 600 to form a subscriber interface loop. The SLIC assembly 600 communicates with a telephony device through tip and ring interfaces 622 and 624.

The CODEC 602 sums the received Vrx signal 604 together with a DC voltage and a voltage representative of the synthesized impedance, and provides the summed signal to the SLIC assembly 600 as a Vdac signal 608. The CODEC also provides a voltage reference 614 to the SLIC assembly. The voltage reference 614 provides accurate reference for detect threshold comparators. In addition, the CODEC 602 provides a control signal 620 to the SLIC assembly 600 to control operations of the SLIC assembly. The control signal 620 sets the internal configuration/gain of the SLIC assembly 600 for the different operating states, e.g., on hook, off hook and ringing. The SLIC assembly also receives battery voltage Vbat 612. The battery voltage Vbat is a power signal for feeding power to the telephony device.

The SLIC assembly provides a feedback signal Vm 610, i.e., metallic (differential) loop voltage, back to the CODEC 602. In the described embodiment, the feedback signal Vm 610 is a voltage that represents the metallic loop current. The CODEC monitors loop conditions using the feedback signal Vm 610. Upon detecting an off hook condition, the SLIC assembly provides a detect signal 616 to the CODEC 602. The SLIC assembly also sends a Vadc signal 618 to the CODEC 602. The Vadc signal may be a difference between the tip signal and the ring signal. The Vadc signal is used to adjust hybrid balance and to provide the upstream transmit signal.

The SLIC assembly in the described embodiment does not require a programming impedance circuit attached to the SLIC assembly/CODEC combination. The impedance synthesis can be performed entirely by the CODEC through DSP processing. The DSP based SLIC assembly/CODEC combination, having control over the DC feed, may provide balanced and non-balanced ringing without external hardware, such as relays, to ground the tip lead. With all signal processing performed in the digital domain, the size of the SLIC die may be reduced and thus a lower cost part may be realized. With a smaller SLIC die size, more SLIC/subscriber channels per die may be implemented to reduce the overall system cost of providing multiple channels in a single package, i.e., saves multiple package cost and increases reliability.

In the described embodiment, the SLIC assembly can be implemented in a quad assembly format where each package includes four SLIC assemblies. In other embodiments, the SLIC assembly may be implemented in other formats.

Figure 8:
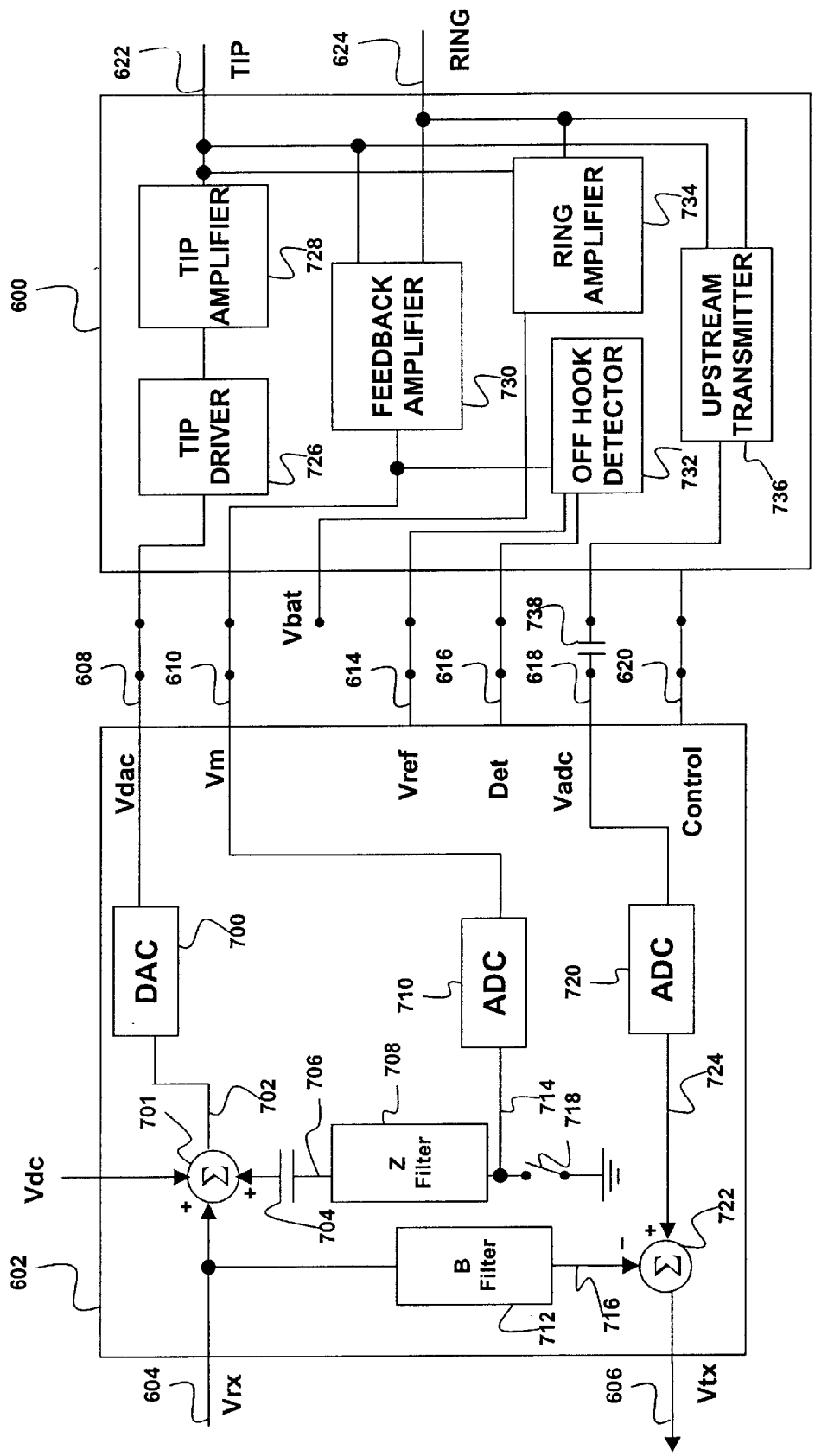
FIG. 8 is a detailed block diagram a CODEC coupled to a DSP-based SLIC.

FIG. 8 is a detailed block diagram of the CODEC 602 coupled to the SLIC assembly 600. The CODEC 602 includes a digital-to-analog converter (DAC) 700 and two analog-to-digital converters 710, 720. The CODEC 602 also include adders 701, 722, a B filter 712 and a Z filter 708. In one embodiment, the CODEC can be embedded software running on a DSP platform. Alternatively, the CODEC can be implemented in hardware.

The Vrx signal 604 received by the CODEC is added in the adder 701 to Vdc, which is a DC voltage provided to the CODEC. The Vrx signal 604 and the Vdc is also added in the adder 701 with an impedance voltage $V_{ZT}$, which is generated by a Z filter 708. The combined circuitry, SLIC/CODEC, measures the current and synthesizes the output voltage in proportion to the Z filter in order to provide the desired impedance. $V_{ZT}$ is the subset voltage that combines with the Vrx signal and the DC control voltage Vdc into an impedance synthesis control voltage to synthesize the impedance.

The Z filter 708 provides the $V_{ZT}$ through a filtering capacitor 704. The filtering capacitor 704 may be a digital filter. The filtering capacitor 704 operates as a high pass filter between the Z filter 708 and the adder 701 to select only the AC portion of the $V_{ZT}$ voltage.

The Z filter is coupled to the feedback signal Vm 610, which represents the metallic loop current, from the SLIC assembly 600, and uses the feedback signal Vm to determine the appropriate $V_{ZT}$ for impedance matching. In the described embodiment, the Z filter 708 is a digital filter based on the desired impedance. The Z filter 708 performs error correction to synthesize the desired impedance. The coefficients of the Z filter 708 may be programmable to synthesize different impedances depending on the application.

The feedback signal Vm 610 is converted to a digital signal by the ADC 710 prior to being provided to the Z filter. The Z filter 708 is also coupled to ground through a switch 718. The switch 718 is used to disable feedback during ringing by coupling the output of the ADC 710 directly to ground.

The feedback signal Vm 610 is provided by a feedback amplifier 730 in the SLIC assembly 600. To provide the feedback signal Vm 610, the feedback amplifier 730 receives the tip and ring signals 622 and 624. The feedback amplifier 730 takes a difference between the ring signal and the tip signal and provides as the feedback signal Vm 610.

The CODEC 602 also provides a reference voltage Vref to an off hook detector 732 in the SLIC assembly. The off hook detector also receives the feedback signal Vm from the feedback amplifier 730 to detect an off hook condition. The off hook condition is detected by comparing the feedback signal Vm with the reference voltage Vref. Upon detecting the off hook condition, the off hook detector 732 provides a detection signal 616 to the CODEC. Upon receiving the detection signal 616, the CODEC signals a call processing center, such as a central office, that off hook condition is detected for call processing.

The CODEC 602 also includes a B filter, which is used to subtract a portion of received signal Vrx from the transmit signal Vtx to cancel hybrid echo. In other words, the B filter is used to optimize hybrid balance or echo cancellation. The B filter 712 measures a sample of the received signal Vrx and provides it to the adder 722 to be subtracted from the Vadc signal supplied by an upstream transmitter 736 of the SLIC 600 through a filtering capacitor 738. The filtering capacitor 738 operates as a high pass filter. The Vadc signal is converted into digital format by the ADC 720 and provided to the adder 722. The difference between the digitized Vadc signal and the B filtered Vrx signal is provided as the Vtx signal 606. The upstream transmitter 736 is coupled to and receives inputs of the tip and ring signals 622 and 624.

The upstream transmitter 736 takes a difference between the tip signal 622 and the ring signal 624, and provides a Vadc signal 618 to CODEC through a filtering capacitor 738. The filtering capacitor 738 blocks the DC component passing only the AC component. The Vadc signal is analog-to-digital converted by the ADC 720 prior to being provided to the adder 722.

The Vdac signal 608 from the DAC 700 of the CODEC 602 is provided to a tip driver 726 of the SLIC 600. The tip driver provides the signal to the tip amplifier 728, which in turn amplifies the provided signal and outputs it as a tip signal over the tip interface 622. The ring amplifier receives the tip signal and provides a ring signal over the ring interface 624. Functions of the tip driver 726, the tip amplifier 728 and the ring amplifier 734 will be described in more detail below in reference to FIG. 9.

Figure 9:
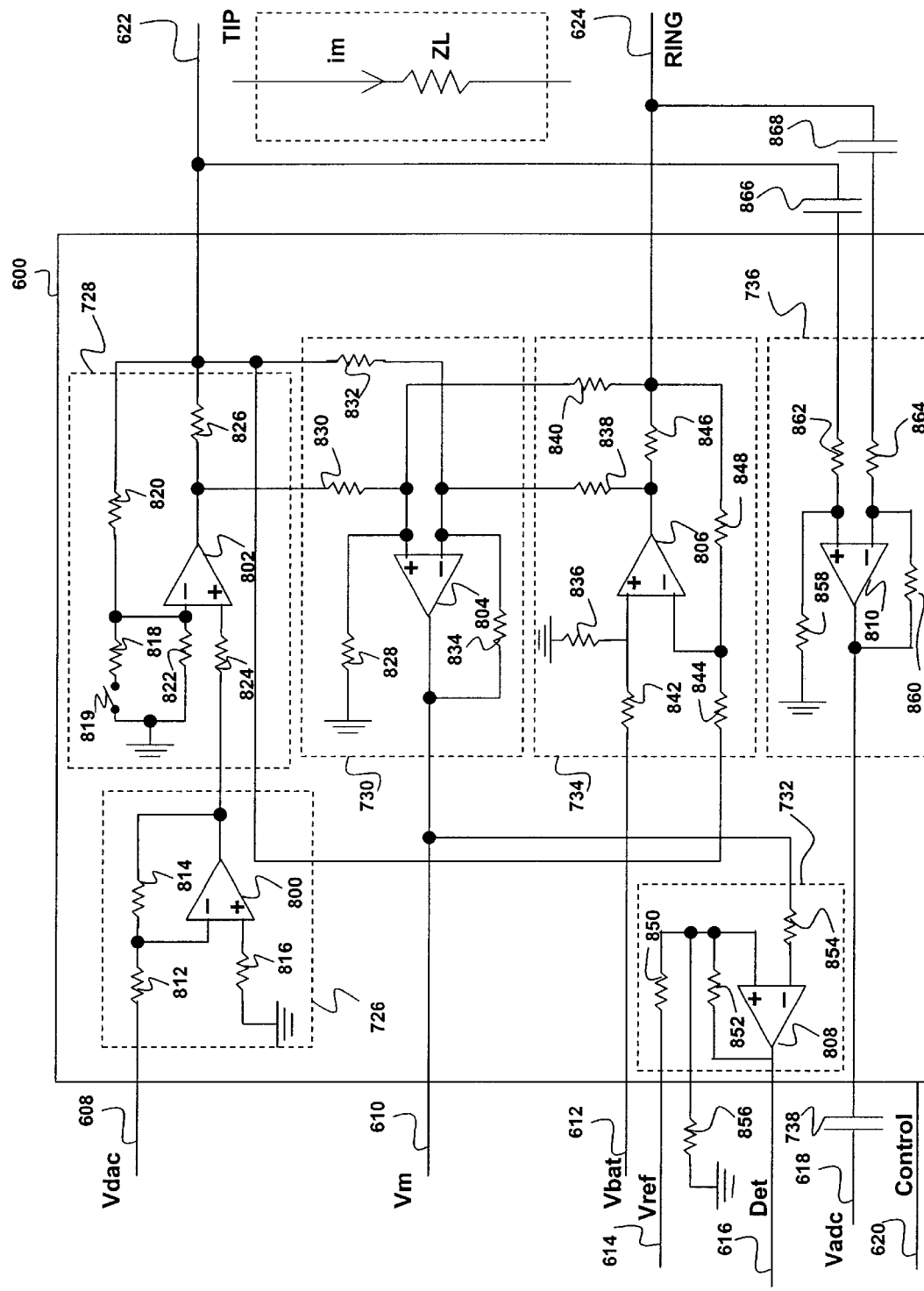
FIG. 9 is a block diagram of a simplified DSP-based SLIC.

FIG. 9 is a circuit diagram of one embodiment of the SLIC assembly 600 illustrated in FIG. 8. The SLIC assembly 600 receives the Vdac signal 608, the Vbat signal 612, the Vref signal 614, ground through a bias resistor 856, and the control signal 620, and provides the feedback signal Vm 610 and the detector signal 616 as well as the tip and ring signals over the tip and ring interfaces 622 and 624.

When a typical telephony device is coupled between the tip and ring interfaces 622 and 624, a current between the tip and ring interfaces is typically represented by im and an impedance between them is typically represented by ZL, which is a load impedance. For upstream transmission, the SLIC assembly 600 receives the tip and ring signals from a telephony device and provides the Vadc signal 618 through the filtering capacitor 738 to the CODEC.

The operation of the SLIC assembly 600 may be more easily understood by analyzing the signals as separate AC and DC components. The Vdac signal 608 is provided to the tip driver 726. The Vdac signal 608 is a composite signal having both AC and DC components including the received voice signal Vrx, the DC operating point Vdc and the impedance synthesis signal $V_{ZT}$.

The tip driver 726 and the tip amplifier 728 provide a programmable gain for the low (on/off hook) and high (ringing) voltage operating states. The tip and ring DC voltages during the on/off hook states may be represented by a set of equations. Note that, with the feedback signal Vm

610, the loop current may be regulated by the CODEC by lowering the tip to ring voltage, i.e., raising the Vdac DC voltage. By raising the Vdac DC voltage, differential tip and ring voltages may be brought closer together. This in turn would typically reduce the current draw.

The tip driver 726 includes an operational amplifier (op amp) 800. The Vdac signal is provided to an inverting input of the op amp 800 through a resistor 812. An output of the op amp 800 is fed back to the inverting input of the op amp 800 through a feedback resistor 814. The resistors 812 and 814 set the gain of the op amp 800. In the described embodiment, the op amp is a unity gain amplifier and the resistors 812 and 814 have identical resistance values. A non-inverting input of the op amp 800 is coupled to ground through a bias resistor 816, which has a resistance value of, e.g., R/2b or (R/b)∥(R/b). Thus, the tip driver 726 is configured as an inverting amplifier since the op amp 800 inverts the input signal with a gain of −(R/b)/(R/b)=−1. Therefore, the tip driver 726 inverts the Vdac signal 608 and provides it to the tip amplifier 728.

The tip amplifier 728 includes an op amp 802, which is used to drive the tip signal. The output of the tip driver, i.e., the inverted Vdac signal, is provided to a non-inverting input of the op amp 802 through a resistor 824. An inverting input of the op amp 802 is coupled to ground through a resistor 822. The resistor 822 and the resistor 824 are used for gain setting and DC offset balancing, respectively. The resistance values for the resistor 822 and the resistor 824 are identical in this embodiment. For example, the resistance values may be RGb for both of the resistors.

The inverting input of the op amp 802 is also coupled to a first terminal of a gain setting resistor 818. A second terminal of the resistor 818 is coupled to ground through a switch 819. The switch is open or closed, depending on the operating state of the SLIC 600, by control signals, e.g., the control signal 620 in FIG. 7, from the CODEC. For example, the resistor 818 may have a resistance value of RGa. Thus, when the switch 819 is open, the resistance between the inverting input of the op amp 802 and ground is the resistance of the resistor 822, which may be RGb.

When the switch 819 is closed, however, the resistor 818 is in parallel with the resistor 822 between the inverting input of the op amp 802 and ground. In this case, the resistance value between the inverting input and ground is equal to the resistance value of the resistors 818 and 812 in parallel. For example, if the resistor 818 has a value of RGa and the resistor 822 has a value of RGb, the resistance value of the resistor equivalent to those two resistors in parallel is equal to RGa∥RGb=((RGa)×(RGb))/(RGa+RGb).

The inverting input of the op amp 802 is also coupled to an output of the op amp 802 through a resistor 826 and a feedback resistor 820 in series. The resistor 826 is a current sensing resistor for sensing the metallic loop current. The resistors 826 and 820 may have values of, e.g., Rf and RG, respectively. Since the inverting input is coupled to ground, the op amp 802 is a non-inverting amplifier. The gain G of the tip amplifier 728, therefore, is (resistance value of the feedback resistor 820+resistance value of the resistor 822)/(resistance value of the resistor 822). For example, if the resistance values of the resistors 820 and 822 are RG and RGb, respectively, the gain G is equal to (RG+RGb)/(RGb)= 1+(RG/RGb). An output of the tip amplifier is provided as the tip signal output over the tip interface 622.

The ring amplifier 734 includes an op amp 806, which is used to drive the ring signal. The op amp 806 provides an output, which is provided through a resistor 846 as the ring signal output over the ring interface 624. The resistor 846 is a current sensing resistor for sensing the metallic loop current. A non-inverting input of the op amp 806 is coupled to a Vbat signal 612 through a voltage divider resistor 842. The non-inverting input of the op amp 806 is also coupled to ground through a voltage divider resistor 836. An inverting input of the op amp 806 receives the tip signal 622 through a gain setting resistor 844. The ring signal is fed back to the inverting output through a feedback resistor 848.

For example, in this embodiment, the resistance values of the resistors 836, 842, 844 and 848 are identical at R. The resistance value of the resistor 846, e.g., is Rf.

The op amp 806 of the ring amplifier 734 is configured to receive inputs of the Vbat signal 612 and the tip signal, which may be expressed as Vtip. Since the Vbat signal is coupled to the non-inverting input of the op amp 806 and the Vtip signal is coupled to the inverting input of the op amp 806, the ring signal, which may be expressed as Vring, is equal to Vbat−Vtip.

Therefore, the relationship between the gain (G), Vtip, Vring and Vtip−ring may be represented by the following equations.

$$G=(1+RG/RGb); \quad \text{Eq. 3.1.1)}$$

$$Vtip=-1\times Vdc\times G; \quad \text{Eq. 3.1.2)}$$

$$Vring=Vbat-Vtip=Vbat+(Vdc\times G); \text{ and} \quad \text{Eq. 3.1.3)}$$

$$Vtip-ring=2Vtip31\ Vbat=-1\times(Vbat+(2Vdc\times G)). \quad \text{Eq. 3.1.4)}$$

For example, for on hook and off hook DC states, if Vdc=1V, RG=390K, RGb=78K and Vbat=−24V, then gain G=6, Vtip=−6V, Vring=−18V and Vtip−ring=12V.

During the ringing state, the gain of the tip amplifier is increased to provide a large DC level on tip and ring interfaces 622 and 624, thus resulting in higher ringing amplitude. A control line from the CODEC activates the switch depending on the state, e.g., on hook, off hook or ringing state. By way of example, when the CODEC operates with 3.3V supply, a gain of 40 is desirable. For such increase in gain, the switch 819 is closed. In this case, equations to represent Vtip and Vring are identical to the equations 3.1.1 through 3.1.4 except that the gain is increased.

Therefore, relationship between G, Vtip, Vring and Vtip−ring may be represented by the following equations.

$$G=(1+RG/(RGa\|RGb)); \quad \text{Eq. 3.2.1)}$$

$$Vtip=-1\times Vdc\times G; \quad \text{Eq. 3.2.2)}$$

$$Vring=Vbat-Vtip=Vbat+(Vdc\times G); \text{ and} \quad \text{Eq. 3.2.3)}$$

$$Vtip-ring=2Vtip-Vbat=-1\times(Vbat+(2Vdc\times G)). \quad \text{Eq. 3.2.4)}$$

For example, using the equations 3.2.1 through 3.2.4, when Vdc=1V, RG=390K, RGa∥RGb=10K and Vbat=−80V, gain G=40, Vtip=−40V, Vring=−40V and Vtip−ring=0V.

The feedback amplifier 730 includes an op amp 804, which is used to drive the feedback signal Vm. The inputs of the op amp 804 are used to measure the differential current of the tip and ring signals. The op amp 804 is used to measure the currents through the current sensing resistors 826, 846 and provide the feed back signal Vm 610, which is a voltage representation of the metallic loop current.

An inverting input of the op amp 804 receives the output of the op amp 806 through a resistor 838. The inverting input of the op amp 804 also receives the tip signal through a resistor 832. In addition, the inverting input of the op amp 804 receives a feedback output of the op amp 804 through a feedback resistor 834.

A non-inverting input of the op amp 804 is coupled to ground through a scaling resistor 828. The non-inverting input of the op amp 804 is also coupled to the output of the op amp 802 through a scaling resistor 830. In addition, the non-inverting input of the op amp 804 is coupled to the ring signal through a scaling resistor 840.

The output of the op amp 804, which is the output of the feedback amplifier 730, is provided to the CODEC as the feedback signal Vm 610. The feedback signal Vm 610 is also provided to the off hook detector 732.

The tip driver 726 and the tip amplifier 728 provide programmable gain for the low (on/off hook) and high (ringing) operating states. As discussed earlier, the gain may be programmed by opening and closing the switch 819 under the control of the control signal 620. Since the Vdac has one DC component Vdc and two AC components Vrx and $V_{ZT}$, the equations that represent AC states are as follows.

$$G=(1+RG/RGb); \quad \text{Eq. 3.3.1)}$$

$$Vtip=-G\times(Vrx+V_{ZT}); \quad \text{Eq. 3.3.2)}$$

$$Vring=G\times(Vrx+V_{ZT}); \text{ and} \quad \text{Eq. 3.3.3)}$$

$$Vtip-ring=-2G\times(Vrx+V_{ZT}). \quad \text{Eq. 3.3.4)}$$

Referring back to FIG. 9, the feedback signal Vm is equal to $2\times im\times Rf/b$, where im is the metallic loop current, Rf is the fuse resistance and b is the attenuator ratio, which typically is between 1 and 10. The metallic loop current is the differential loop current between tip and ring signals. The fuse resistance includes current limiting resistance. The attenuator ratio is a ratio used to divide voltage down to common mode range of input voltage. Thus, the feedback signal Vm is a scaled voltage representation of the metallic loop current im. This scaled voltage is sampled by the ADC 710 in FIG. 8, and then processed digitally through the Z filter to adjust the output impedance of the SLIC. Therefore, for example, the feedback signal summed with the received voice signal is therefore $V_{ZT}=Z\times Vm=2\times Z\times im\times Rf/b$.

When Vrx equals zero, the AC output impedance is thus Zo=Vtip-ring/im, which results in Eq. 3.3.5) Zo=$-2G\times V_{ZT}$ =$-4G\times Z\times Rf/b$. For example, when Vrx=0, RG=390K, RGb=78K, G=6, Rf=25 ohms, Z=10, b=10, and |Zo|=600 ohms.

When Zo does not match Zload, the 4w–2w gain is Eq. 3.3.6) Gain 4w–2w=Vtip-ring/Vrx=−2G. With Zo matching Zload, i.e., 600 ohms, the 4w–2w gain is reduced by a factor of 2, which results in Eq. 3.3.7) Gain 4w–2w=−G where Zo=Zload. Zo is a SLIC/CODEC output impedance and Zload is a telephony device and loop impedance.

During the ringing state, the CODEC preferably shuts down the feedback signal from the SLIC by, for example, closing the switch 718 in FIG. 8. This typically will effectively eliminate the impedance matching functions to provide the maximum amplitude for ringing a telephony device such as a telephone. With G=40 during the ringing state, the 4w–2w gain is thus Eq. 3.4.1) Gain 4w–2w=Vtip-ring/Vrx=−2G. For example, when Vrx=0.5VAC, RG=390K, RGb∥RGa=10K, G=40 and Rf=25 ohms, Gain 4w–2w=−80 (with Zo=0 ohms) and |Vtip-ring|=40VAC. Note with 1VDC and 0.5VAC, this provides a 1V DC signal with a 1.4VPP AC riding on it at the output of the DAC. This would allow a common mode range of 0.3V to 1.7V at the output of the DAC, which should be consistent with a 3V process.

The upstream transmitter 736 is coupled to the tip signal and the ring signal through ac-coupling capacitors 866 and 868, respectively. The ac-coupling capacitors 866 and 868 operate as high pass filters. The upstream transmitter 736 composes the AC components of the tip signal and the ring signal, and provides the composite upstream voice signal to the CODEC 602 in FIG. 8. The hybrid balance function preferably is provided in the digital domain through digital signal processing (DSP) by the CODEC.

The upstream transmitter 736 includes an op amp 810, which is used to drive a Vadc signal. A non-inverting input of the op amp 810 is coupled to ground through a scaling resistor 858. The non-inverting input of the op amp 810 is also coupled to the tip signal through a resistor 862 and the ac-coupling capacitor 866 in series. An inverting input of the op amp 810 is coupled to the ring signal through a resistor 864 and the ac-coupling capacitor 868 in series. The output of the op amp 810 is fed back to the inverting input of the op amp 810 through a resistor 860. The output of the op amp 810 is provided to the CODEC through a filtering capacitor 738, which operates as a high pass filter, as the Vadc signal.

The SLIC assembly 600 provides a low power loop monitoring function to alert the CODEC. The detector signal 616 is provided to the CODEC by the off hook detector 732. The off hook detector 732 includes an op amp 808. An inverting input of the op amp 808 is coupled to the feedback signal Vm through a resistor 854.

A non-inverting input of the op amp 808 is coupled to a reference voltage Vref through a scaling resistor 850. The non-inverting input of the op amp 808 is also coupled to ground through a resistor 856. The resistor 856 can be a threshold resistor with the resistance value of, e.g., Rth. The non-inverting input of the op amp 808 is also coupled to the detector signal output 616 through a feedback resistor 852.

A logic low detector signal 616 is provided when loop current is received by the inverting input of the op amp 808 through the resistor 854, indicating an off hook condition. The off hook condition is indicated when the feedback signal Vm exceeds the scaled reference voltage. The detect threshold is set by the resistance value Rth of the threshold resistor 856, with hysteresis provided by the SLIC assembly. Without the hysteresis, the op amp 808, which is a comparator, may go into oscillation.

Once the logic in the CODEC has been activated, e.g., following a power down state, the CODEC monitors loop conditions using the metallic feedback signal Vm 610, and provides filtering during the loop monitoring function. Note that it has been assumed that the CODEC, i.e., the DSP process in the CODEC, will monitor the loop current and provide the ring trip filtering and detection function since during the ringing state, the logic will be awake and active. A dial pulse function may also be monitored using the detection signal and/or through the DSP and the metallic feedback signal Vm. The dial pulse function is monitored by looking for the detect signal to toggle.

Figures 10A, 10B:
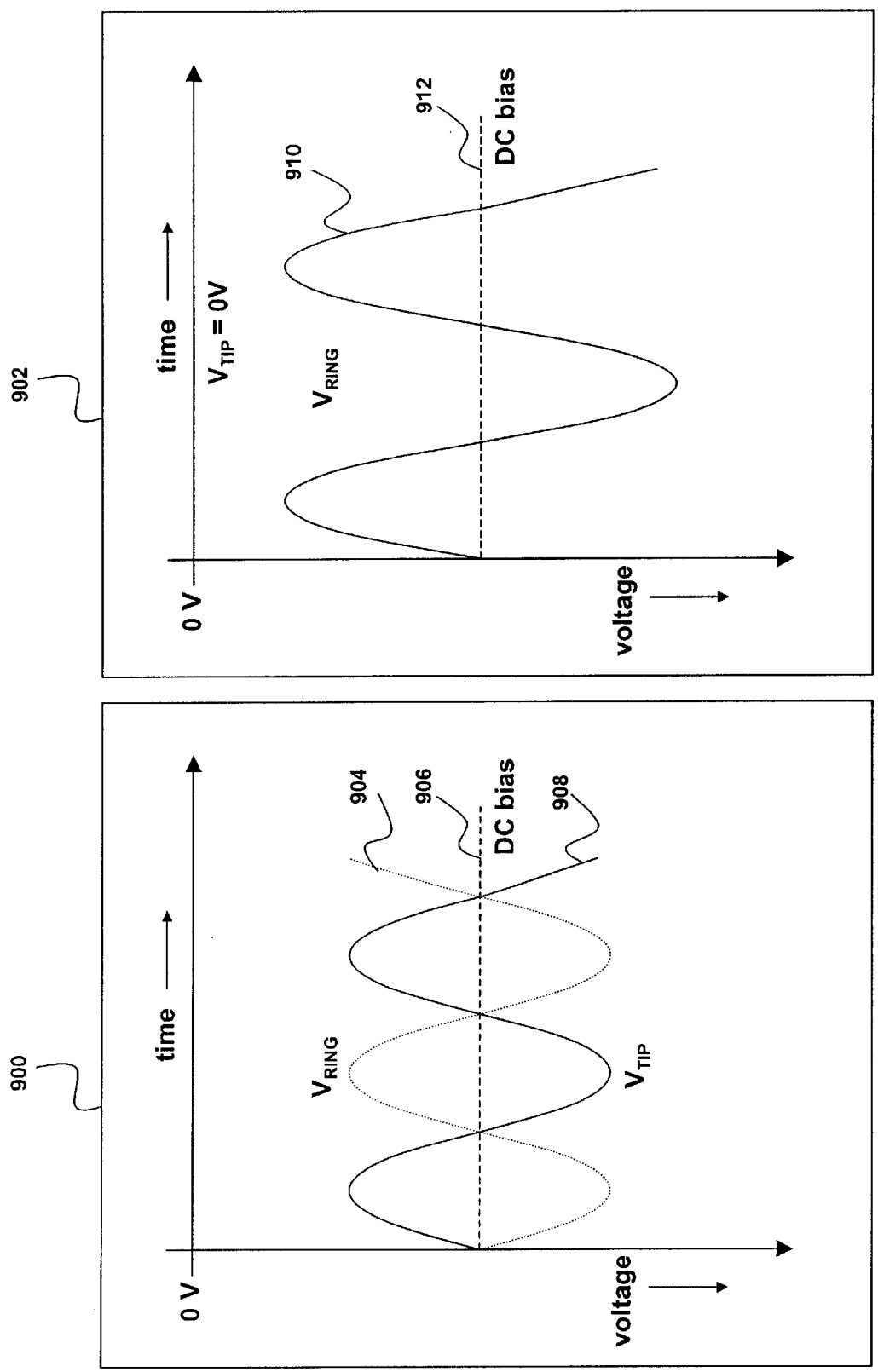
FIG. 10A is a time line that illustrates $V_{RING}$ and $V_{TIP}$ voltages for a balanced ring system.
FIG. 10B is a time line that illustrates $V_{RING}$ and $V_{TIP}$ voltages for an unbalanced ring system.

FIG. 10A is a voltage graph 900 that illustrates a Vtip signal 908 and a Vring signal 904 during a balanced ringing mode in one embodiment of the present invention. In this embodiment, the signals have a negative DC bias 906 about which they oscillate during balanced ringing. FIG. 10B is a voltage graph 902 that illustrates a Vring signal 910 during a non-balanced ringing mode in an alternate embodiment. The Vring signal 910 oscillate about a negative DC bias 912. A Vtip signal remains grounded at 0V.

Figure 11:
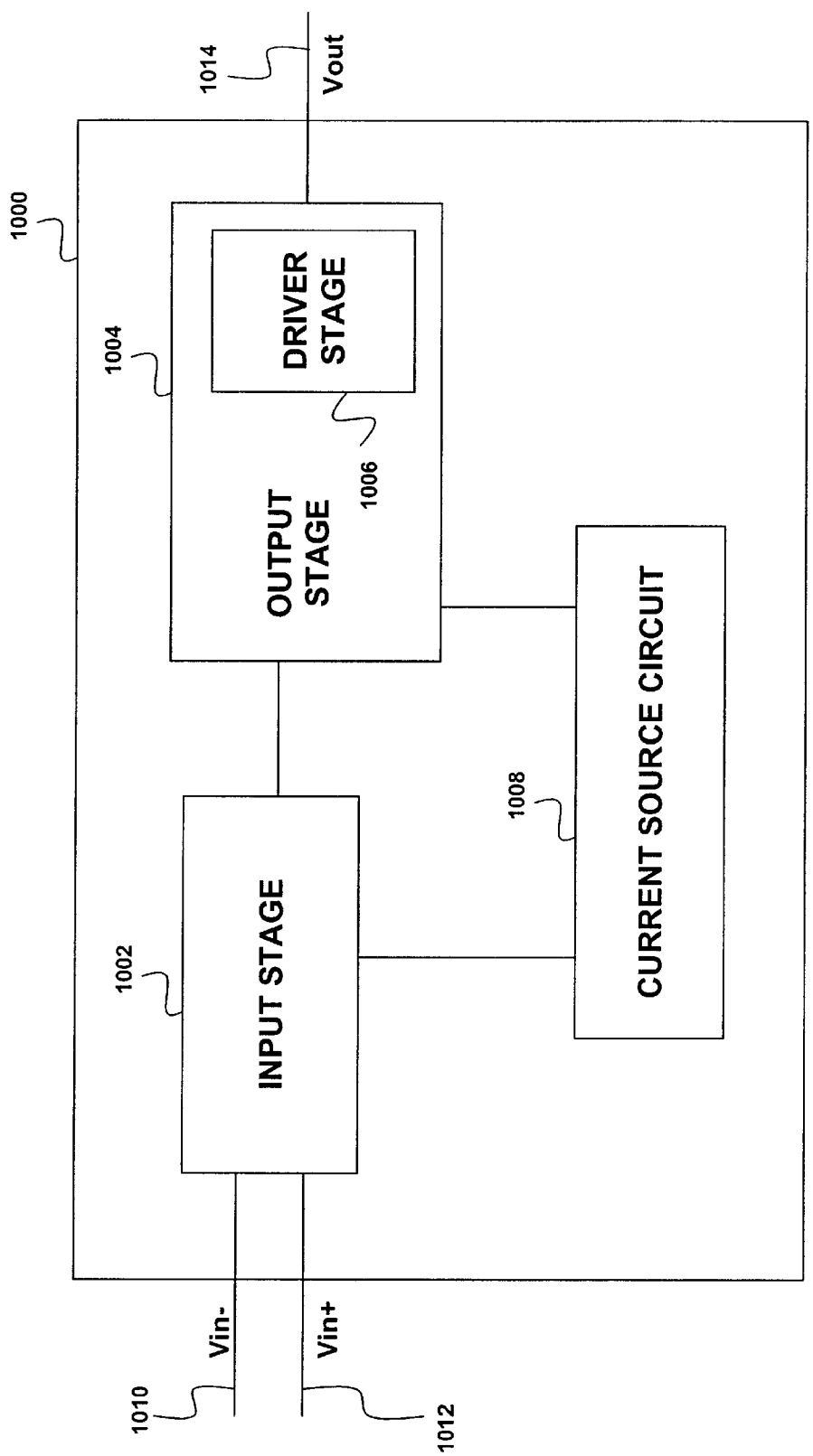
FIG. 11 is a block diagram of an operational amplifier (op-amp)

4. Composite MOSFET Bipolar Complimentary Symmetry Driver with Local Feedback for Bias Stabilization FIG. 11 is a block diagram of an op amp 1000. The op amp 1000 may be used as one or more of the op amps used in the SLIC assembly 600 of FIG. 9. The op amp 1000 may also be used in the SLIC interface circuit of FIG. 4, the SLIC assembly of FIG. 6 or any other circuit that uses op amps. The op amp 1000 receives inverting and non-inverting input signals Vin– 1010 and Vin+ 1012. The input signals are received by an input stage 1002 and provided to an output stage 1004. The output stage 1004 may include a driver stage 1006 for driving an output signal Vout 1014. Currents are established by a current source 1008.

Figure 12:
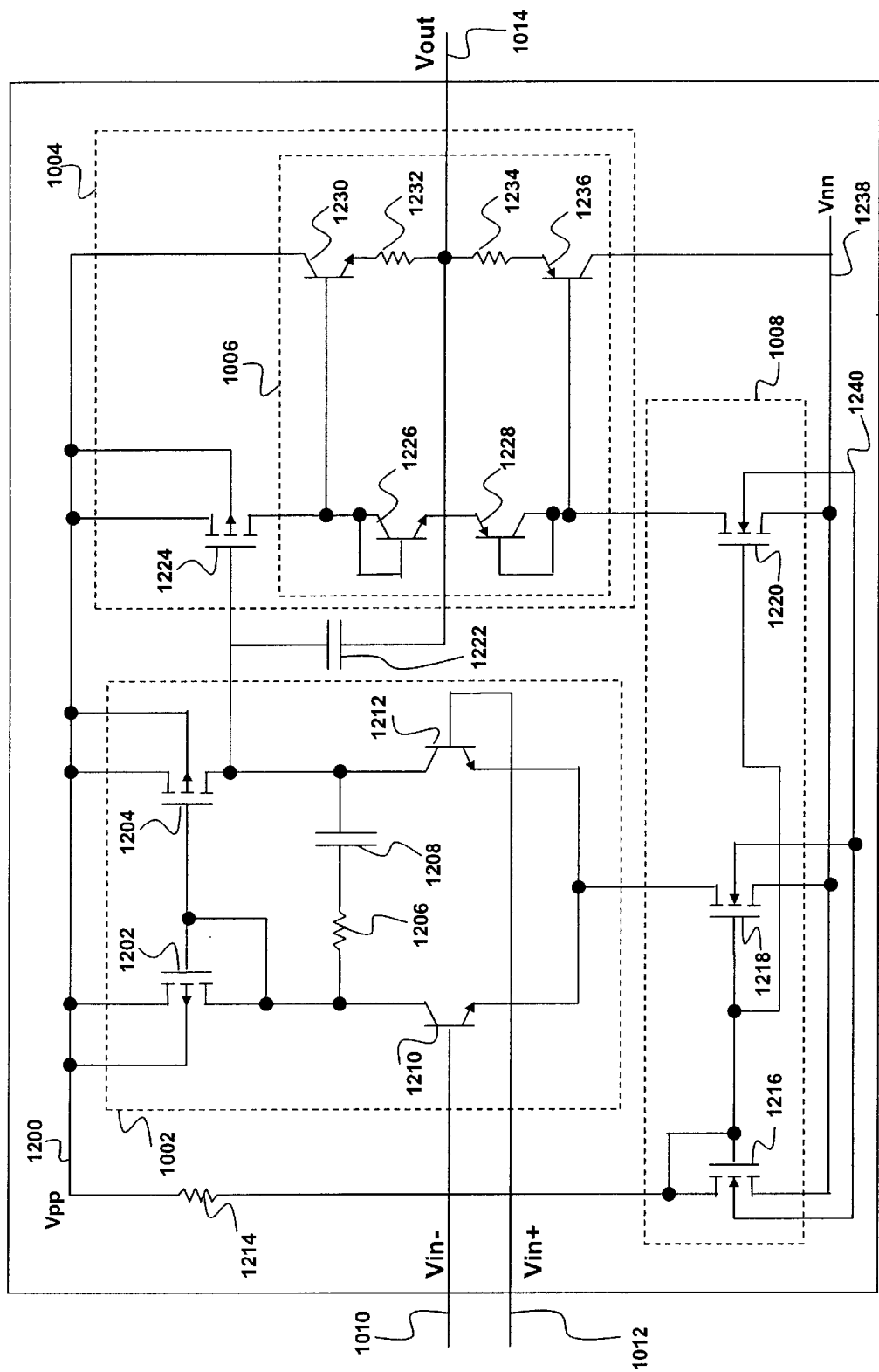
FIG. 12 is a detailed circuit diagram of a low voltage op-amp.

FIG. 12 is a circuit diagram of a low voltage op amp 1000 that corresponds to the block diagram of the op amp 1000 in FIG. 11. The op amp 1000 includes an input stage 1002, and output stage 1004 with a drive stage 1006, and a current source circuit 1008. The op amp 1000 receives input signals Vin– 1010 and Vin+ 1012, and outputs an output signal Vout 1014.

The input signals Vin– 1010 and Vin+ 1012 are provided to bases of NPN bipolar transistors 1210 and 1212, respectively, in the input stage 1002. The input stage 1002 also includes p-channel MOSFET's 1202 and 1204. The NPN transistors 1210 and 1212 control the amount of current that flows through the p-channel MOSFET 1202 and the p-channel MOSFET 1204, respectively. The p-channel MOSFET's 1202 and 1204 can be PMOS devices. In addition, the input stage 1002 includes a resistor 1206 and a capacitor 1208 coupled in series between collectors of the NPN transistors 1210 and 1212. The resistor 1206 and a capacitor 1208 form a compensation network for stability.

The collectors of the NPN transistors 1210 and 1212 are coupled to drains of the p-channel MOSFET's 1202 and 1204, respectively. Sources of the p-channel MOSFET's 1202 and 1204 are coupled to a positive voltage supply bus Vpp 1200.

Substrates of the MOSFET's 1202 and 1204 are also coupled to the positive voltage supply bus Vpp 1200. A gate of the p-channel MOSFET 1202 is coupled to the drain of the p-channel MOSFET 1202. Thus, the p-channel MOSFET is configured as a diode and current flows through the p-channel MOSFET 1202 and the NPN transistor 1210. The amount of this current is controlled by the voltage applied at the base of the NPN transistor 1210, i.e., the inverting input signal Vin– 1010. A gate of the p-channel MOSFET 1204 is also coupled to the gate and the drain of the p-channel MOSFET 1202.

Emitters of the NPN transistors 1210 and 1212 are coupled to the current source 1008, which is used to provide currents that flow through the NPN transistors 1210 and 1212, respectively. The currents through each NPN transistor 1210 and 1212 is controlled by the voltage applied at its respective bases of NPN transistors 1210 and 1212, respectively.

Since the current controlled by the current source circuit 1008 is substantially constant under quiescent conditions, the sum of the currents flowing through the NPN transistors 1210 and 1212 are substantially constant as well. Thus, the ratio of the currents flowing through the NPN transistors 1210 and 1212 is determined by the ratio of the respective voltages of the input signals Vin– 1010 and Vin+ 1012. The drain of the p-channel MOSFET 1204 is coupled to the output stage 1004 and is provided as the output Vout 1014 through a compensation capacitor 1222 and the output stage 1004.

The current source circuit 1008 includes n-channel MOSFETs 1216, 1218 and 1220. The n-channel MOSFETs 1216, 1218 and 1220 may be VMOS devices. The emitters of the NPN transistors 1210 and 1212 in the input stage 1002 are coupled to a drain of the n-channel MOSFET 1218. A drain of the n-channel MOSFET 1216 is coupled to the positive voltage supply bus Vpp 1200 through a resistor 1214. The drain and a gate of the n-channel MOSFET 1216 are coupled to each other. Thus, the n-channel MOSFET 1216 is configured as a diode current source.

Sources of the n-channel MOSFET's 1216, 1218 and 1220 are coupled to a negative voltage supply bus Vnn 1238. Thus, the n-channel MOSFET 1216 is configured as a diode, and current passes from the positive voltage bus Vpp 1200 through the resistor 1214 and the n-channel MOSFET 1216 to the negative voltage supply bus Vnn 1238, thereby fixing the gate voltage of the n-channel MOSFET 1216. Substrates of the n-channel MOSFET's 1216, 1218 and 1220 are coupled to a substrate voltage 1240.

The gate of the n-channel MOSFET 1216 is also coupled to gates of the n-channel MOSFET's 1218 and 1220, thereby fixing the gate voltage of each n-channel MOSFET in the current source 1008. Thus, the n-channel MOSFET 1216 is coupled in a current mirror configuration with the n-channel MOSFET's 1218 and 1220. In this current mirror configuration, the current through each of the n-channel MOSFET's 1218 and 1220 are similar in magnitude to the current through the n-channel MOSFET 1216 provided that the n-channel MOSFET's 1218 and 1220 have similar dimensions to the n-channel MOSFET 1216 and similar voltages are applied to their drains as the voltage applied at the drain of the n-channel MOSFET 1216.

The output stage 1004 includes a p-channel MOSFET 1224 and the driver stage 1006. A source and a substrate of the p-channel MOSFET 1224 is coupled to the positive voltage supply bus Vpp 1200. A gate of the p-channel MOSFET 1224 is coupled to the drain of the p-channel MOSFET 1204 in the input stage and a first terminal of the compensation capacitor 1222. A drain of the p-channel MOSFET 1224 is coupled to the driver stage 1006. The driver stage 1006 is coupled to a source of the n-channel MOSFET 1220 in the current source 1008. Thus, a current from the positive voltage supply bus Vpp 1200 that flows through the p-channel MOSFET 1224 and provided to the drive stage 1006 is controlled by the voltage at the drain of the p-channel MOSFET 1220.

The driver stage 1006 includes NPN bipolar transistors 1226, 1230 and PNP bipolar transistors 1228, 1236. A collector of the NPN transistor 1226 is coupled to the drain of the p-channel MOSFET 1224 in the output stage 1004. The collector of the NPN transistor 1226 is also coupled to a base of the NPN transistor 1226. Thus, the NPN transistor 1226 is configured as a diode. An emitter of the NPN transistor 1226 is coupled to an emitter of the PNP transistor 1228. A base and a collector of the PNP transistor 1228 is coupled to each other. Thus, the NPN transistor 1228 is also configured as a diode. The collector of the PNP transistor 1228 is also coupled to the drain of the n-channel MOSFET 1220 in the current source circuit 1008.

The drain of the p-channel MOSFET 1224 and the collector of the NPN transistor 1226 are also coupled to a base of the NPN transistor 1230. A collector of the NPN transistor 1230 is coupled to the positive voltage supply bus Vpp 1200. An emitter of the NPN transistor 1230 is coupled to the output signal Vout 1014 through a resistor 1232.

An emitter of the PNP transistor 1236 is coupled to the output signal Vout 1014 through a resistor 1234. A base of the PNP transistor 1236 is coupled to the collector of the PNP transistor 1228 and the drain of the n-channel MOSFET 1220. A collector of the PNP transistor 1236 is coupled to a negative voltage supply bus Vnn 1238.

The described Class A-B output stage with biasing transistors turned on reduces crossover since current is always flowing. Thus, the transistors 1226 and 1228, configured as diodes, are used as bias compensating diodes. The transistors 1230 and 1236 are output transistors. When a current is provided through the transistors 1226 and 1228, they provide a diode drop voltage. That will turn on the output transistors 1230 and 1236 slightly. The resistors 1232 and 1234 provide local feedback to stabilize the bias point.

If the output transistors 1230 and 1236 are not turned on this way, no bias current may flow through time at the time of zero volt cross over, and the transistors 1230 and 1236 will be turned off, causing a cross over distortion in the output signal Vout 1014. As current flows through the transistors 1226 and 1228, the output transistors 1230 and 1236 will always stay on, and the cross over distortion will be reduced. With the bias compensation of the drive stage 1006, the bias point may be stabilized, along with emitter degeneration, over dynamic operating conditions such as temperature.

The bipolar transistors 1230 and 1236 are used as power drivers in the driver stage. The bipolar transistors 1230 and 1236 operate as a Class A-B push-pull amplifier. When the voltage at the drain of the p-channel MOSFET 1204 is sufficiently low, e.g., lower than a threshold voltage, $V_{31}$, the p-channel MOSFET 1224 allows a current to flow through it, and voltage at the drain of the p-channel MOSFET 1224 approaches the positive power supply voltage Vpp.

As voltage at the drain of the p-channel MOSFET 1224 increases, the $V_{BE}$ (base-to-emitter voltage) of the NPN transistor 1230 increases since the drain of the p-channel MOSFET 1224 is coupled to the base of the NPN transistor 1230. As the $V_{BE}$ increases, the coupling between the positive voltage supply bus Vpp 1200 and the output Vout 1014 strengthens, and therefore, the output Vout 1014 tends to be driven up toward the positive power supply voltage, Vpp.

Meanwhile, voltage at the collector of the PNP transistor 1228 tends to increase as well, thus tending to turn off the PNP transistor 1236 as the VBE increases since the collector of the PNP transistor 1228 is coupled to the base of the PNP transistor 1236. Therefore, the output Vout 1014 tends not to be driven down as strongly toward the negative power supply voltage, Vnn.

On the other hand, as voltage applied at the gate of the p-channel MOSFET 1224 increases, the p-channel MOSFET 1224 tends to turn off, isolating the positive power supply Vpp from the drain of the p-channel MOSFET 1224. Since the drain of the p-channel MOSFET 1224 is coupled to the base of the NPN transistor 1230, the NPN transistor 1230 tends to turn off, and the output Vout 1014 does not tend to be driven up toward the positive supply voltage Vpp.

Meanwhile voltage at the collector of PNP 1228 tends to decrease as well, thus tending to turn on PNP 1236. Thus, the PNP transistor 1236 tends to drive the output Vout 1014 down toward the negative supply voltage Vnn.

Figure 13:
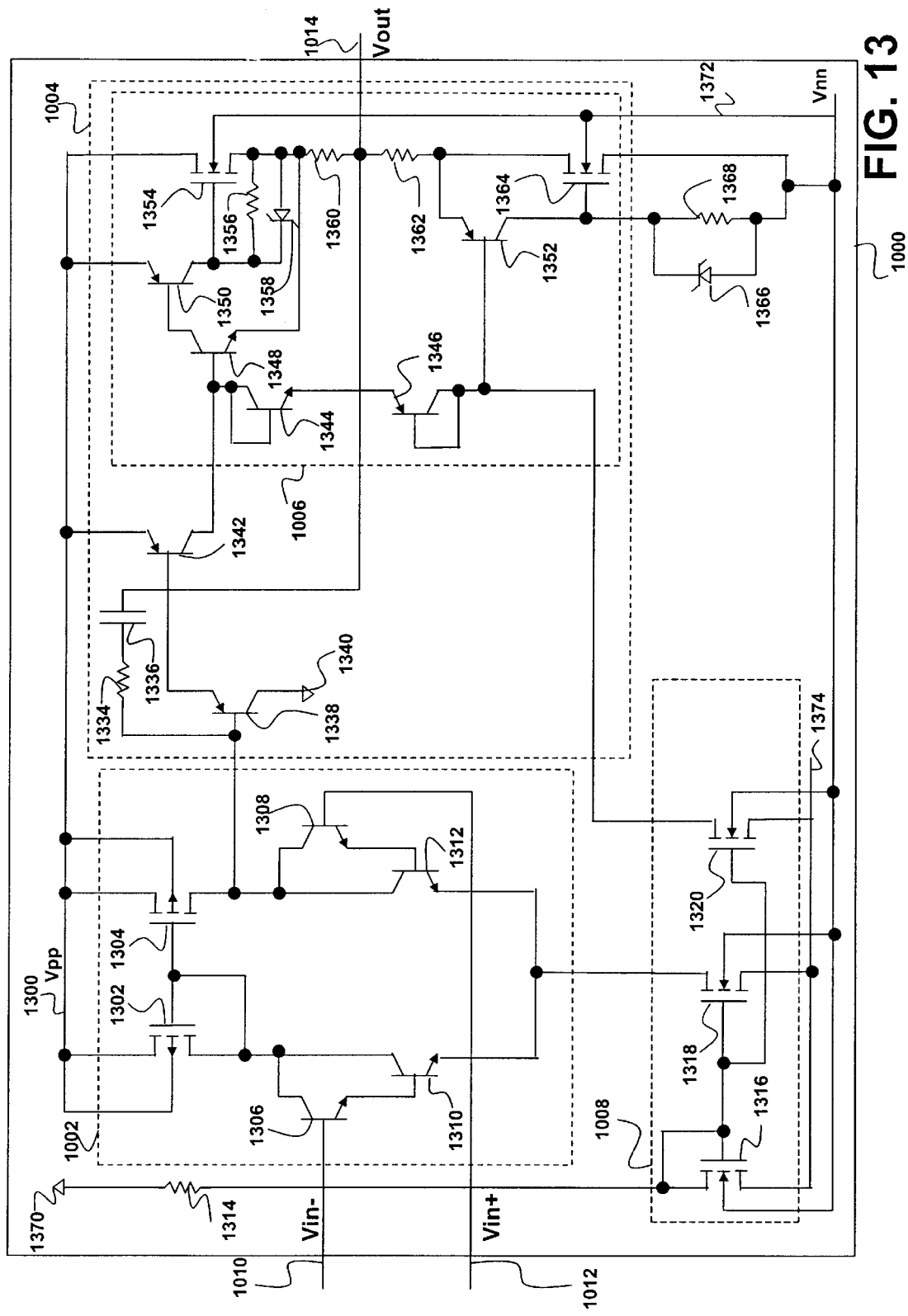
FIG. 13 is a detailed circuit diagram of a high voltage op-amp.

FIG. 13 is a circuit diagram of a high voltage op amp 1000 that corresponds to the block diagram of the op amp 1000 in FIG. 11. The op amp 1000 includes an input stage 1002, an output stage 1004 with a drive stage 1006, and a current source 1008. The op amp 1000 receives input signals Vin− 1010 and Vin+ 1012, and outputs an output signal Vout 1014.

The input stage 1002 includes p-channel MOSFET's 1302 and 1304. The p-channel MOSFET's 1302 and 1304 can be PMOS devices. The input stage 1002 also includes NPN bipolar transistors 1306, 1308, 1310 and 1312. The NPN bipolar transistors 1306 and 1308 are input transistors that receive inverting and non-inverting inputs Vin− and Vin+, respectively.

Sources of the p-channel MOSFET's 1302 and 1304 are coupled to a positive voltage supply bus Vpp 1300. Gates of the p-channel MOSFET's 1302 and 1304 are coupled to each other. The gate of the p-channel MOSFET 1302 is also coupled to a drain of the p-channel MOSFET 1302. Thus, the p-channel MOSFET 1302 is configured as a diode, and the p-channel MOSFET's 1302 and 1304 act as an active load current mirror.

A drain of the p-channel MOSFET 1302 is also coupled to collectors of the NPN transistors 1306 and 1310. A base of the NPN transistor 1306 receives an inverting input signal Vin− 1010. An emitter of the NPN transistor 1306 is coupled to a base of the NPN transistor 1310. A drain of the p-channel MOSFET 1304 is coupled to a collector of the NPN transistor 1308 and a collector of the NPN transistor 1312. The drain of the p-channel MOSFET 1304 is also coupled to the output stage 1004. A base of the NPN transistor 1308 is coupled to a non-inverting input signal Vin+. An emitter of the NPN transistor 1308 is coupled to a base of the NPN transistor 1312. Emitters of the NPN transistors 1310 and 1312 are coupled to each other and also coupled to the current source 1008.

The current drawn by the current source circuit 1008 from the emitters of the NPN transistors 1310 and 1312 is substantially constant under quiescent conditions. Therefore, the sum of currents flowing through the NPN transistors 1310 and 1312 are substantially constant as well. The ratio between the currents flowing through the NPN transistor 1310 and the NPN transistor 1312, respectively, is controlled by the ratio of input voltages Vin− 1010 and Vin+ 1012.

The current source circuit 1008 includes n-channel MOSFET's 1316, 1318 and 1320. These MOSFET's are configured either as a diode or a current mirror, and are used as current source for the input stage 1002 and the output stage 1004. The n-channel MOSFET's 1316, 1318 and 1320 can be VMOS devices. Substrates of the n-channel MOSFET's 1316, 1318 and 1320 are coupled to a substrate voltage 1374. Sources of the n-channel MOSFET's 1316, 1318 and 1320 are coupled to the negative voltage supply bus Vnn 1372. Alternatively, the substrates of the n-channel MOSFET's 1316, 1318 and 1320 are coupled to the negative voltage supply bus Vnn 1372.

A drain and a gate of the n-channel MOSFET 1316 are coupled to each other. Thus, the n-channel MOSFET 1316 is configured as a diode. The drain of the n-channel MOSFET 1316 is also coupled to a positive voltage source 1370 through a resistor 1314. Thus the current flowing through the n-channel MOSFET 1316 is controlled by the resistance value of the resistor 1314.

Gates of the n-channel MOSFET's 1318 and 1320 are coupled to the gate of the n-channel MOSFET 1316. Thus, the n-channel MOSFET's 1318 and 1320 are configured as current mirrors to the n-channel MOSFET 1316. Therefore, currents flowing through the n-channel MOSFET's 1318 and 1320 is similar in magnitude to the current flowing through the n-channel MOSFET 1316 under quiescent conditions provided that the n-channel MOSFET's 1318 and 1320 have similar dimensions as the n-channel MOSFET 1316 and the voltages at the drains of the n-channel MOSFET's 1318 and 1320 are similar to the voltage at the drain of the n-channel MOSFET 1316.

The drain of the n-channel MOSFET 1318 is coupled to the emitters of the NPN transistors 1310 and 1312 in the input stage 1002. The drain of the n-channel MOSFET 1320 is coupled to the output stage 1004.

The output stage 1004 includes PNP bipolar transistors 1338, 1342 and a driver stage 1006. A base of the PNP transistor 1338 is coupled to the drain of the p-channel MOSFET 1304 in the input stage 1002. The voltage at the drain of the p-channel MOSFET 1304 is provided as an output signal Vout 1014 through a resistor 1334 and a compensation capacitor 1336 in series. The resistor 1334 and the compensation capacitor 1336 form an R-C compensating network. A collector of the PNP transistor 1338 is coupled to a negative voltage supply 1340, e.g., ground. An emitter of the PNP transistor 1338 is coupled to a base of the PNP transistor 1342. An emitter of the PNP transistor 1342 is coupled to the positive voltage supply bus Vpp 1300. A collector of the PNP transistor 1342 is coupled to the driver stage 1006.

The driver stage 1006 includes NPN bipolar transistors 1344, 1348, PNP bipolar transistors 1346, 1350, 1352, and n-channel MOSFET's 1354, 1364. A collector of the NPN transistor 1344 is coupled to the collector of the PNP transistor 1342 of the output stage 1004. The collector of the NPN transistor 1344 is also coupled to a base of the NPN transistor 1344 and a base of the NPN transistor 1348. Thus, the NPN transistor 1344 is configured as a diode. An emitter of the NPN transistor 1344 is coupled to an emitter of the PNP transistor 1346. A base and a collector of the PNP transistor 1346 are coupled to each other. Thus, the PNP transistor 1346 is configured as a diode. A collector of the PNP transistor 1346 is coupled to the drain of the n-channel MOSFET 1320 in the current source 1008. Therefore, the NPN transistor 1344 and the PNP transistor 1346 are configured as bias compensating diodes.

The bias compensating diodes are used for bias control and stability, and the use of these diodes results in enhanced performance such as low distortion, low quiescent power dissipation and dynamic control of bias point. Therefore, the bias currents for the output MOSFET's, i.e., n-channel MOSFET's 1354, 1364 are set with the accurate bipolar devices configured as diodes.

The collector of the NPN transistor 1348 is coupled to a base of the PNP transistor 1350. An emitter of the NPN transistor 1348 is coupled to a source of the n-channel MOSFET 1354. An emitter of the PNP transistor 1350 is coupled to the positive voltage supply bus Vpp 1300. A collector of the PNP transistor 1350 is coupled to a gate of the n-channel MOSFET 1354. The NPN transistor 1348 and the PNP transistor 1350 provide level and polarity shift to allow the use of n-channel MOSFET's only as the output MOSFET's rather than using both n-channel and p-channel MOSFET's.

The collector of the PNP transistor 1350 is also coupled to a source of the n-channel MOSFET 1354 through a gate discharge resistor 1356 and a gate protection Zener diode 1358 in parallel. A drain of the n-channel MOSFET 1354 is coupled to the positive voltage supply bus Vpp 1300. A substrate of the n-channel MOSFET 1354 is coupled to the negative voltage supply bus Vnn 1372. The source of the n-channel MOSFET 1354 is coupled to the output signal Vout 1014 through a current-limiting resistor 1360.

An emitter of the PNP transistor 1352 is coupled to the output signal Vout 1014 through a current-limiting resistor 1362. A base of the PNP transistor 1352 is coupled to the collector of the PNP transistor 1346. A collector of the PNP transistor 1352 is coupled to the negative voltage supply bus Vnn 1372 through a gate protection Zener diode 1366 and a resistor 1368 in parallel. The collector of the PNP transistor 1352 is also coupled to a gate of the n-channel MOSFET 1364. A drain of the n-channel MOSFET 1364 is coupled to the emitter of the PNP transistor 1352, and also, through the resistor 1362, coupled to the output signal Vout 1014. A substrate of the n-channel MOSFET 1364 is coupled to the negative voltage supply bus Vnn 1372. The current-limiting resistors 1360, 1362 provide bias point stabilization of the FET bias currents.

As the voltage decreases at the base of the PNP transistor 1338, the base-to-emitter voltage ($V_{BE}$) increases, and the PNP transistor 1338 tends to turn on. As the $V_{BE}$ reaches a threshold voltage (Vth), the PNP transistor 1338 turns on, and the negative supply voltage 1340 pulls down the voltage at the base of the PNP transistor 1342, turning on the PNP transistor 1342. When the PNP transistor 1342 turns on, the positive voltage supply Vpp pulls up the voltage at the base of the NPN transistor 1348, thus turning on the NPN transistor 1348.

As the NPN transistor 1348 turns on, the $V_{BE}$ of the PNP transistor 1350 tends to increase, turning on the PNP transistor 1350 to apply the positive supply voltage Vpp at the gate of the n-channel MOSFET 1354. When the n-channel MOSFET 1354 is turned on, the n-channel MOSFET 1354 tends to drive the output Vout 1014 toward the positive supply voltage Vpp. Meanwhile, the positive supply voltage Vpp also tends to pull up the base of the PNP transistor 1352 through the NPN transistor 1344 and the PNP transistor 1346 which are configured as bias compensating diodes. Therefore, the PNP transistor 1352 is not turned on, and does not drive the output Vout 1014 toward the negative voltage supply Vnn.

When the voltage applied at the base of the PNP transistor 1338 is sufficiently high such that $V_{BE}$ <Vth, the PNP transistor 1338 does not turn on, and the PNP transistor 1342 does not turn on. No substantial current flow through the NPN transistor 1344 and the PNP transistor 1346. The NPN transistor 1348, the PNP transistor 1350 and the n-channel MOSFET 1354 do not turn on. Therefore, the output Vout 1014 is not pulled up toward the positive supply voltage Vpp.

Meanwhile, voltage at the collector of PNP 1346 tends to decrease as well thus tending to turn on PNP 1352. As the PNP transistor 1352 turns on, the gate of the n-channel MOSFET 1364 is pulled up, turning on the n-channel MOSFET 1364. As the n-channel MOSFET 1364 turns on, it drives the output Vout 1014 toward the negative supply voltage Vnn.

Having now described the invention in accordance with the requirements of the patent statutes, those skilled in this art will understand how to make changes and modifications in the present invention to meet their specific requirements or conditions. Such changes and modifications may be made without departing from the scope and spirit of the invention as set forth in the following claims.

Conventional driver amplifiers, such as low distortion amplifiers and class A–B amplifiers, typically use a bias current in the driver to reduce cross-over distortion. Traditionally, bipolar devices are used for drivers because of their low $V_{BE}$ turn-on voltage and their low temperature coefficient for $V_{BE}$.

FIG. 14 illustrates an example conventional bipolar driver 1400 including bipolar transistors 1402 and 1404, bias compensating diodes 1406 and 1408, and resistors 1410 and 1412. The bipolar transistors 1402 and 1404 provide currents from respective emitter terminals. The currents are controlled by voltage differences across respective base/emitter junctions ("$V_{BE}$"). The base voltages are controlled by the bias compensating diodes 1406 and 1408. The emitter voltages depend upon the current flowing through the resistors 1410 and 1412. For example, as the current through the resistor 1410 increases, the voltage across the resistor 1410 increases, which increases the emitter voltage. When the emitter voltage increases, $V_{BE}$ decreases, which reduces the current provided by the emitter. The resistors 1410 and 1412 thus provide closed-loop feedback bias control. This is referred to herein as emitter degeneration.

The conventional bipolar bias compensation circuit 1400 allows the bias point to be stabilized, along with emitter degeneration, over dynamic operating conditions, such as temperature, process, and aging. A drawback of bipolar drivers, such as the example illustrated in FIG. 14, is that they require current drive for bias control.

MOSFETs, on the other hand, are voltage-controlled devices which require virtually no current drive. Also, MOSFET drive circuits tend to be relatively simple. However, MOSFET gate threshold voltages are often inconsistent and vary over temperature to a greater degree than bipolar devices. This presents problems with bias set point and bias stability. MOSFET biasing circuits thus tend to be more elaborate and complicated.

In accordance with an aspect of the present invention, a driver includes bipolar and MOSFET devices, whereby bias points are controlled via bipolar $V_{BE}$ junctions, and high power delivery is provided by MOSFETs.

FIG. 15 illustrates an example composite MOSFET-bipolar complimentary symmetry driver stage 1500, in accordance with an aspect of the invention. The driver stage 1500 is similar to the driver stage 1006 illustrated in FIG. 13.

The driver stage 1500 provides the bias control and stability of bipolar junction devices, with the drive capabilities of MOSFET devices. Small signal bipolar devices for bias control and stability greatly increase performance such as low distortion, low quiescent power dissipation, and dynamic control of bias point.

Operation of the driver stage 1500 is now described. When a signal is applied to an input terminal 1502, diodes D1 and D2 bias the signal to provide a base voltage to a bipolar transistor Q1. An emitter terminal of the bipolar transistor Q1 is coupled to a node 1. When a voltage between the base and emitter of the bipolar transistor Q1, (a base-to-emitter voltage $V_{BE1}$), exceeds a threshold of Q1, a base current $i_{B1}$, a collector current $i_{C1}$, and an emitter current $i_{E1}$, flow as illustrated. The currents depend upon, among other things, the amplitude of the base-to-emitter voltage $V_{BE1}$. As will be seen, the emitter voltage at the node 1 is controlled by a feedback resistor, R2

The collector current $i_{C1}$, of bi-polar transistor Q1 is also a base current of a second bi-polar transistor Q2. The current $i_{C1}$, causes a collector current $i_{C2}$ and an emitter current $i_{E2}$ of the bipolar transistor Q2 to flow as illustrated. The Q2 collector current $i_{C2}$ flows through a resistor R1, which generates a voltage at a node 2, which is coupled to a gate terminal of a MOSFET M1. The voltage at the node 2 controls the MOSFET M1 to source a current $i_{M1}$ to the feedback resistor R2.

As the current $i_{M1}$ flows through the second resistor R2, and to a lesser extent, the currents $i_{E1}$ and $i_{C2}$, they generate a feedback voltage at the node 1. As $i_{M1}$ increases, the feedback voltage at the node 1 increases. This reduces the voltage $V_{BE1}$ at the bipolar transistor Q1, which reduces the currents $i_{C1}$, and $i_{E1}$. The reduced current $i_{C1}$ reduces the currents $i_{E2}$ and $i_{C2}$. The reduced current $i_{C2}$ reduces the voltage at the node 2. The reduced voltage at the node 2 causes the MOSFET M1 to reduce the current $i_{M1}$.

Conversely, when the current $i_{M1}$ decreases, the voltage at the node 1 falls, which increases the current $i_{E1}$ and $i_{C1}$, which increases the currents $i_{E2}$ and $i_{C2}$, which increases the voltage at the node 2, which controls the MOSFET M1 to source more current $i_{M1}$. A third bipolar transistor Q3 operates in a similar fashion with respect to a second input, a second MOSFET M2, and a current $i_{M2}$. Thus, the diodes D1 and D2, and the bi-polar transistors Q1, Q2, and Q3, bias the MOSFETs M1 and M2 with feedback to control the currents $i_{M1}$ and $i_{M2}$ to an output terminal 1504.

In an embodiment, the diodes D1 and D2 are implemented with bipolar devices similar to Q1, Q2, and Q3, so that each are substantially equally affected by any process and/or temperature variations.

In the example of FIG. 15, the MOSFETs M1 and M2 are illustrated as N-channel MOSFETs. This is advantageous from an integration perspective because the resistivity of N-material is inherently lower than P-material. This translates into a smaller die size and a lower cost part. The present invention is not, however, limited to N-type MOSFET devices. Based on the description herein, one skilled in the relevant art(s) will understand that the invention can be implemented with P-type MOSFETs and/or combinations of N-type and P-type MOSFETs.

What is claimed is:

1. A MOSFET-bipolar driver, comprising:
   a MOSFET output driver;
   at least one first bipolar transistor coupled to the MOSFET output driver;
   a feedback path coupled between said first bipolar transistor and an output of said MOSFET; and
   a diode-connected second bipolar transistor coupled to a base of said first bipolar transistor, said diode-connected second bipolar transistor biasing said first bipolar transistor;
   wherein said first bipolar transistor biases said MOSFET to output a current, said feedback path provides an indication of said current from said MOSFET to said first bipolar transistor, and said first bipolar transistor adjusts said bias in response to said indication.

2. A MOSFET-Bipolar driver with local feedback for bias stabilization, comprising:
   an input terminal;
   an output terminal;
   a feedback resistance coupled between said output terminal and a first node;
   a MOSFET current source coupled between said first node and said input terminal;
   at least one bipolar transistor coupled between said input terminal and said MOSFET current source, and coupled to said feedback resistance; and
   at least one diode coupled to said input terminal;
   whereby said at least one diode and said at least one bipolar transistor bias said MOSFET to provide a current to said output terminal through said feedback resistance, thereby generating a feedback voltage across said feedback resistance;
   whereby said at least one bipolar transistor adjusts said bias to said MOSFET in response to said feedback voltage.

3. The apparatus according to claim 2, wherein said at least one bipolar transistor comprises:

an NPN bipolar transistor having a base terminal coupled to said input terminal and an emitter terminal coupled to said first node; and a PNP bipolar transistor having a base terminal coupled to a collector terminal of said NPN bipolar transistor, a collector terminal coupled to a second node;

wherein said MOSFET comprises an N-channel MOSFET having a gate terminal coupled to said second node, a drain terminal coupled to an emitter terminal of said PNP bipolar transistor, and a source terminal coupled to said first node;

said apparatus further comprising a second resistance coupled between said first and second nodes.

4. The apparatus according to claim 3, further comprising:

a Zener diode coupled between said first and second nodes, in parallel with said second resistance.

5. The apparatus according to claim 3, wherein at least one of said at least one diodes comprises a bipolar transistor configured as a diode.

6. A MOSFET-Bipolar complimentary symmetry driver with local feedback for bias stabilization, comprising:

first and second input terminals;

at least one diode coupled between said first and second input terminals;

an output terminal;

a first feedback resistance coupled to said output terminal;

a first MOSFET current source coupled to said first feedback resistance;

a first set of one or more bipolar transistors coupled between said first input terminal and said first MOSFET;

a second feedback resistance coupled to said output terminal;

a second MOSFET current source coupled to said second feedback resistance;

a second set of one or more bipolar transistors coupled between said second input terminal and said second MOSFET;

whereby said at least one diode and said first and second sets of at least one bipolar transistor bias said first and second MOSFET current sources in response to first and second signals provided to said first and second input terminals, respectively, to provide current to said output terminal through said first and second feedback resistance, thereby generating first and second feedback voltages across said first and second feedback resistances;

whereby said first and second sets of at least one bipolar transistor adjust said bias to said first and second MOSFET current sources, respectively, in response to said feedback voltages.

7. The apparatus according to claim 6, wherein said at least one diode comprises at least one bipolar transistor configured as a diode.

8. The apparatus according to claim 6, wherein:

said first feedback resistance is coupled between said output terminal and a first node;

said first MOSFET current source comprises a first N-channel MOSFET current source having a source terminal coupled to said first node and a drain terminal coupled to a relatively high potential;

said first set of one or more bipolar transistors comprises;

a first PNP bipolar transistor having a collector terminal coupled to a second node, and an emitter terminal coupled to said relatively high potential, and an NPN bipolar transistor having a base terminal coupled to said first input terminal, an emitter terminal coupled to said first node, and a collector terminal coupled to a base terminal of said first PNP bipolar transistor;

said second feedback resistance is coupled between said output terminal and a third node;

said second MOSFET current source comprises a second N-channel MOSFET current source having a drain terminal coupled to said third node and a source terminal coupled to a relatively low potential, and a gate terminal coupled to a fourth node;

said second set of one or more bipolar transistors comprises a second PNP bipolar transistor having a base terminal coupled to said second input terminal, an emitter terminal coupled to said third node, and a collector terminal coupled to said fourth node;

the apparatus further comprising;

a third resistance coupled between said first and second nodes, and a fourth resistance coupled between said fourth node and said relatively low potential.

9. The apparatus according to claim 8, further comprising:

a first Zener diode coupled between said first and second nodes; and a second Zener diode coupled between said fourth node and said relatively low potential.

10. The apparatus according to claim 8, wherein said at least one diode comprises at least one bipolar transistor configured as a diode.

* * * * *